(12) United States Patent
Okumura

(10) Patent No.: US 8,970,020 B2
(45) Date of Patent: Mar. 3, 2015

(54) SEMICONDUCTOR DEVICE

(75) Inventor: Keiji Okumura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/348,602

(22) PCT Filed: Jun. 18, 2012

(86) PCT No.: PCT/JP2012/065533
§ 371 (c)(1),
(2), (4) Date: Mar. 29, 2014

(87) PCT Pub. No.: WO2013/046824
PCT Pub. Date: Apr. 4, 2013

(65) Prior Publication Data
US 2014/0231926 A1      Aug. 21, 2014

(30) Foreign Application Priority Data

Sep. 30, 2011   (JP) .................................. 2011-217717

(51) Int. Cl.
*H01L 23/495*        (2006.01)
*H01L 27/06*         (2006.01)
(Continued)

(52) U.S. Cl.
CPC ............ *H01L 27/0629* (2013.01); *H01L 25/04* (2013.01); *H01L 25/18* (2013.01); *H01L 24/48* (2013.01); *H01L 24/49* (2013.01); *H01L 2224/48137* (2013.01); *H01L 2224/48464* (2013.01); *H01L 2224/48471* (2013.01); *H01L 2224/32245* (2013.01);
(Continued)

(58) Field of Classification Search
CPC ............ H01L 2224/48247; H01L 2224/48091
USPC .......................... 257/666, 676, 723, 734, 782
See application file for complete search history.

(56) References Cited

U.S. PATENT DOCUMENTS

| 2001/0048154 A1 | 12/2001 | Cheah et al. | |
| 2006/0244091 A1 | 11/2006 | Kikuchi et al. | |
| 2013/0082284 A1* | 4/2013 | Okumura ........................ | 257/77 |
| 2014/0231926 A1* | 8/2014 | Okumura ...................... | 257/401 |

FOREIGN PATENT DOCUMENTS

| JP | 2001-358288 A | 12/2001 |
| JP | 2006-165151 A | 6/2006 |
| JP | 2006-310790 A | 11/2006 |
| JP | 2011-014744 A | 1/2011 |

* cited by examiner

*Primary Examiner* — Jack Chen
(74) *Attorney, Agent, or Firm* — Rabin & Berdo, P.C.

(57) ABSTRACT

Provided is a semiconductor device which includes a bonding wire, one end of which is connected to a bipolar device, the other end of which is connected to a conductive member, and the center of which is connected to a unipolar device, said semiconductor device being capable of improving the reliability of wire bonding. A package (4) includes a die pad (61), a source lead (63), a first MOSFET (11), and a first Schottky barrier diode (21). A source electrode ($11_S$) of the first MOSFET (11), an anode electrode ($21_A$) of the first Schottky barrier diode (21), and the source lead (63) are electrically connected by the bonding wire (31), one end of which is bonded to the source electrode ($11_S$) of the first MOSFET (11), the other end of which is bonded to the source lead (63), and the center of which is bonded to the anode electrode ($21_A$) of the first Schottky barrier diode (21).

20 Claims, 11 Drawing Sheets

(51) Int. Cl.
*H01L 25/04* (2014.01)
*H01L 25/18* (2006.01)
*H01L 23/00* (2006.01)

(52) U.S. Cl.
CPC ............... *H01L 2224/48247* (2013.01); *H01L 2224/4903* (2013.01); *H01L 2224/49111* (2013.01); *H01L 2224/73265* (2013.01); *H01L 2924/19107* (2013.01); *H01L 2924/13055* (2013.01); *H01L 2924/13091* (2013.01); *H01L 2924/30107* (2013.01); *H01L 2224/45144* (2013.01)
USPC ............ 257/666; 257/676; 257/723; 257/734; 257/782

SEMICONDUCTOR DEVICE

TECHNICAL FIELD

The present invention relates to a semiconductor device.

BACKGROUND ART

MOSFETs (Metal-Oxide-Semiconductor Field Effect Transistors) are used as switching devices in electronic circuits such as inverter circuits and converter circuits. MOSFETs include a parasitic PN junction diode (body diode) as a bipolar device. In an electronic circuit in which a MOSFET is used, when a current flows through a parasitic PN junction diode (body diode) of the MOSFET, the properties of the device may deteriorate. Specifically, when a current flows through the PN junction diode, an electron-hole recombination may occur at a crystal fault, if it exists in the MOSFET, to result in an expansion of the crystal fault.

In particular, in an SiC-MOSFET prepared with semiconductor materials mainly including SiC, when a current flows through a PN junction diode, a forward deterioration occurs. More specifically, it is known that a crystal fault called Basal Plane Dislocation (BPD) exists in an SiC semiconductor crystal. The crystal structure at the BPD is different from those in other portions, that is, the band gap of the crystal is smaller than the inherent band gap of the SiC semiconductor. The BPD is therefore likely to be an electron-hole recombination center. Accordingly, when a forward current flows through the PN joint portion, the BPD expands to be a planar fault (stacking fault). This leads to an increase in the on-resistance of the SiC-MOSFET.

In order to prevent a current from flowing through a PN junction diode, a circuit configuration has hence been proposed in which a Schottky barrier diode having an operating voltage lower than that of the PN junction diode is connected in parallel to the PN junction diode.

RELATED ART DOCUMENT

Patent Document

Patent Document 1: Japanese Unexamined Patent Publication No. 2006-310790

SUMMARY OF THE INVENTION

Problems to be Solved by the Invention

However, even employing such a circuit configuration with a parallel-connected Schottky bather diode could result in a phenomenon that a current flows through the PN junction diode. The inventor of this application has found that this phenomenon is caused by the parasitic inductance of the current path passing through the Schottky barrier diode. That is, when a current starts flowing through the Schottky barrier diode, the parasitic inductance of the current path passing through the Schottky barrier diode generates a back electromotive force. When the back electromotive force reaches the forward turn-on voltage of the PN junction diode, which is connected in parallel to the Schottky barrier diode, a current flows through the PN junction diode.

It is hence an object of the present invention to provide a semiconductor device with a bipolar device through which a current is prevented from flowing.

Means for Solving the Problems

The present invention is directed to a first semiconductor device including a die pad, a bipolar device die-bonded to a surface of the die pad, the bipolar device having a first electrode pad on a surface opposite to a die-bonded surface, a unipolar device die-bonded to the surface of the die pad, the unipolar device having a second electrode pad to be connected electrically to the first electrode pad on a surface opposite to a die-bonded surface, a conductive member disposed laterally to the die pad to be connected electrically with the second electrode pad, and a bonding wire, one end of which is bonded to the first electrode pad, the other end of which is bonded to the conductive member, and the center of which is bonded to the second electrode pad. A first wire portion of the bonding wire between the portion bonded to the first electrode pad and the portion bonded to the second electrode pad is at an angle of 90 degrees or more, in a plan view, with respect to a second wire portion of the bonding wire between the portion bonded to the second electrode pad and the portion bonded to the conductive member.

The connection between the portion of the bonding wire bonded to the second electrode pad and the first wire portion as well as the connection between the portion of the bonding wire bonded to the second electrode pad and the second wire portion are likely to be under load. In the present invention, the angle between the first wire portion and the second wire portion is 90 degrees or more in a plan view, which cannot cause unnecessary load and therefore strength reduction, whereby it is possible for the connections to have increased strength.

In a preferred embodiment of the present invention, the die pad has a quadrangular shape in a plan view. The conductive member is disposed in a manner opposed to a portion near one end of a predetermined first side of the die pad in a plan view. One of the four sides of the die pad extending perpendicular to the first side from the one end of the first side near which the conductive member is disposed being defined as a second side in a plan view, the unipolar device is disposed at a position closer to the second side and the first side of the die pad than the bipolar device. In accordance with this arrangement, it is possible to increase the angle between the first wire portion and the second wire portion.

In addition, the unipolar device being disposed at a position closer to the second side and the first side of the die pad than the bipolar device means that the center of gravity of the unipolar device is disposed at a position closer to the second side and the first side of the die pad than the center of gravity of the bipolar device.

In a preferred embodiment of the present invention, the bipolar device has a quadrangular shape in a plan view. The bipolar device is die-bonded to the die pad at a posture rotated, from a posture in which the four sides of the bipolar device are parallel, respectively, with the four sides of the die pad in a plan view, by a required angle with respect to the die pad such that the corresponding opposed sides of the bipolar device and the die pad are not parallel with each other. The length direction of one of the four sides of the bipolar device inclined with respect to the first side of the die pad in a manner coming close to the first side so as to come close to the second side of the die pad is parallel, in a plan view, with the length direction of the portion of the bonding wire bonded to the first electrode pad.

In accordance with the arrangement above, it is possible to increase the bonding area between the bonding wire and the first electrode pad and therefore the bonding strength between the bonding wire and the first electrode pad can be increased. This allows the wire bonding to be more reliable.

In a preferred embodiment of the present invention, the bipolar device has a rectangular shape in a plan view. The long sides of the bipolar device are inclined with respect to the first side of the die pad and extend toward the intersection between the first side and the second side of the die pad. In accordance with this arrangement, it is possible to further increase the bonding area between the bonding wire and the first electrode pad.

In a preferred embodiment of the present invention, the unipolar device has a quadrangular shape in a plan view. The unipolar device is die-bonded to the die pad at a posture rotated, from a posture in which the four sides of the unipolar device are parallel, respectively, with the four sides of the die pad in a plan view, by a required angle with respect to the die pad such that the corresponding opposed sides of the unipolar device and the die pad are not parallel with each other. The length direction of one of the four sides of the unipolar device inclined with respect to the first side of the die pad in a manner coming close to the first side so as to come close to the second side of the die pad is parallel, in a plan view, with the length direction of the portion of the bonding wire bonded to the second electrode pad.

In accordance with the arrangement above, it is possible to increase the bonding area between the bonding wire and the second electrode pad and therefore the bonding strength between the bonding wire and the second electrode pad can be increased. This allows the wire bonding to be more reliable.

In a preferred embodiment of the present invention, the unipolar device has a rectangular shape in a plan view. The long sides of the unipolar device are inclined with respect to the first side of the die pad and extend toward the intersection between the first side and the second side of the die pad. In accordance with this arrangement, it is possible to further increase the bonding area between the bonding wire and the second electrode pad.

In a preferred embodiment of the present invention, the surface opposite to the die-bonded surface of the bipolar device is provided with a third electrode pad at a position different from that of the first electrode pad, the third electrode pad corresponding to a gate electrode if the bipolar device is a MOS transistor, to a gate electrode if the bipolar device is an IGBT, or to a base electrode if the bipolar device is a bipolar transistor. The third electrode pad is disposed at one of the corners on the surface of the bipolar device farther from the second side but closer to the first side of the die pad.

In a preferred embodiment of the present invention, the die pad has a quadrangular shape in a plan view. The conductive member is disposed in a manner opposed to a portion near one end of a predetermined first side of the die pad in a plan view. One of the four sides of the die pad extending perpendicular to the first side from the one end of the first side near which the conductive member is disposed being defined as a second side in a plan view, the bipolar device and the unipolar device are disposed side by side in the direction parallel with the second side and the unipolar device is disposed closer to the first side than the bipolar device. In accordance with this arrangement, it is possible to increase the angle between the first wire portion and the second wire portion.

In a preferred embodiment of the present invention, the bipolar device has a quadrangular shape in a plan view. The bipolar device is die-bonded to the die pad at a posture in which the four sides of the bipolar device are parallel, respectively, with the four sides of the die pad in a plan view. The length direction of one of the four sides of the bipolar device parallel with the second side of the die pad is parallel, in a plan view, with the length direction of the portion of the bonding wire bonded to the first electrode pad.

In accordance with the arrangement above, it is possible to increase the bonding area between the bonding wire and the first electrode pad and therefore the bonding strength between the bonding wire and the first electrode pad can be increased. This allows the wire bonding to be more reliable.

In a preferred embodiment of the present invention, the unipolar device has a quadrangular shape in a plan view. The unipolar device is die-bonded to the die pad at a posture in which the four sides of the unipolar device are parallel, respectively, with the four sides of the die pad in a plan view. The length direction of one of the four sides of the unipolar device parallel with the second side of the die pad is parallel, in a plan view, with the length direction of the portion of the bonding wire bonded to the second electrode pad.

In accordance with the arrangement above, it is possible to increase the bonding area between the bonding wire and the second electrode pad and therefore the bonding strength between the bonding wire and the second electrode pad can be increased. This allows the wire bonding to be more reliable.

In a preferred embodiment of the present invention, the surface opposite to the die-bonded surface of the bipolar device is provided with a third electrode pad at a position different from that of the first electrode pad, the third electrode pad corresponding to a gate electrode if the bipolar device is a MOS transistor, to a gate electrode if the bipolar device is an IGBT, or to a base electrode if the bipolar device is a bipolar transistor. The third electrode pad is disposed at one of the corners on the surface of the bipolar device farther from the second side but closer to the first side of the die pad.

In a preferred embodiment of the present invention, the first wire portion is shorter than the second wire portion. The angle between the portion of the bonding wire bonded to the second electrode pad and the first wire portion is greater, in a plan view, than the angle between the portion of the bonding wire bonded to the second electrode pad and the second wire portion.

Since the first wire portion is shorter than the second wire portion, the first wire portion is less likely to absorb an external force such as a pulling force, if applied thereto, than the second wire portion. Hence, the angle between the portion of the bonding wire bonded to the second electrode pad and the first wire portion is made greater than the angle between the portion of the bonding wire bonded to the second electrode pad and the second wire portion, so that the strength of the connection between the portion of the bonding wire bonded to the second electrode pad and the first wire portion is higher than the strength of the connection between the portion of the bonding wire bonded to the second electrode pad and the second wire portion.

In a preferred embodiment of the present invention, multiple sets of the bipolar device and the unipolar device are disposed on the surface of the die pad in a spaced manner in the direction parallel with the second side of the die pad and connected in parallel to each other.

In a preferred embodiment of the present invention, another bipolar device having a fourth electrode pad and another unipolar device having a fifth electrode pad are disposed side by side between the bipolar device and the unipolar device on the surface of the die pad, and the center of the first wire portion is bonded to the fourth electrode pad and the fifth electrode pad.

In a preferred embodiment of the present invention, the die pad has a quadrangular shape in a plan view, in which the conductive member is disposed in a manner opposed to a portion near one end of a predetermined first side of the die pad in a plan view, and in which one of the four sides of the die pad extending perpendicular to the first side from the one end of the first side near which the conductive member is disposed being defined as a second side in a plan view, the unipolar device is disposed at a position closer to the second side of the die pad than the bipolar device. Multiple bonding wires are provided and disposed in a spaced manner in a plan view, in which the angle between the first wire portion and the second wire portion is greater at the position of each bonding wire farther from the first side of the die pad.

In accordance with the arrangement above, it is easy to bond the center of each of the multiple bonding wires to the second electrode pad.

In a preferred embodiment of the present invention, the multiple bonding wires are two bonding wires, in which the bipolar device has a rectangular shape in a plan view and the first electrode pad has a rectangular shape in a plan view, and the bipolar device is die-bonded to the die pad at a posture in which the long sides of the bipolar device are parallel with the second side of the die pad. The first bonded portion of one of the two bonding wires positioned farther from the first side of the die pad is bonded to one of two regions defined by bisecting the surface of the first electrode pad along the second side of the die pad, the one region being farther from the first side. On the other hand, the first bonded portion of the other of the two bonding wires positioned closer to the first side of the die pad is bonded to the other of the two regions defined by bisecting the surface of the first electrode pad along the second side of the die pad, the other region being closer to the first side.

In accordance with the arrangement above, it is easy to bond the one end of each of the two bonding wires to the first electrode pad.

In a preferred embodiment of the present invention, the unipolar device has a square shape in a plan view and the second electrode pad has a square shape in a plan view, in which the unipolar device is die-bonded to the die pad at a posture in which the four sides of the unipolar device are parallel, respectively, with the four sides of the die pad. One of the four vertices of the second electrode pad closer to the first side and the second side of the die pad being defined as a first vertex, one of the four vertices closer to the first side but farther from the second side of the die pad being defined as a second vertex, the vertex diagonal to the first vertex being defined as a third vertex, and the vertex diagonal to the second vertex being defined as a fourth vertex, the second bonded portion of one of the two bonding wires positioned farther from the first side of the die pad is bonded to one of two regions defined by bisecting the surface of the second electrode with the diagonal line running between the first vertex and the third vertex, the one region being closer to the fourth vertex. The second bonded portion of the other of the two bonding wires positioned closer to the first side of the die pad is bonded to the other of the two regions defined by bisecting the surface of the second electrode pad with the diagonal line, the other region being closer to the second vertex.

In accordance with the arrangement above, it is easy to bond the center of each of the two bonding wires to the second electrode pad.

In a preferred embodiment of the present invention, the center of gravity of the unipolar device is disposed at a position closer to the first side of the die pad than the center of gravity of the bipolar device in a plan view.

In a preferred embodiment of the present invention, the bipolar device includes a PN junction diode structure and the unipolar device includes a Schottky barrier diode.

The present invention is directed to a second semiconductor device including two first semiconductor devices, in which the first electrode pad in one of the first semiconductor devices is connected to the die pad in the other of the first semiconductor devices through a connective metal member.

The above and further objects, features, and advantages of the present invention will be apparent from the following detailed description of preferred embodiments as illustrated in the accompanying drawings.

MODES FOR CARRYING OUT THE INVENTION

Preferred embodiments of the present invention will hereinafter be described in detail with reference to the accompanying drawings.

Figure 1:
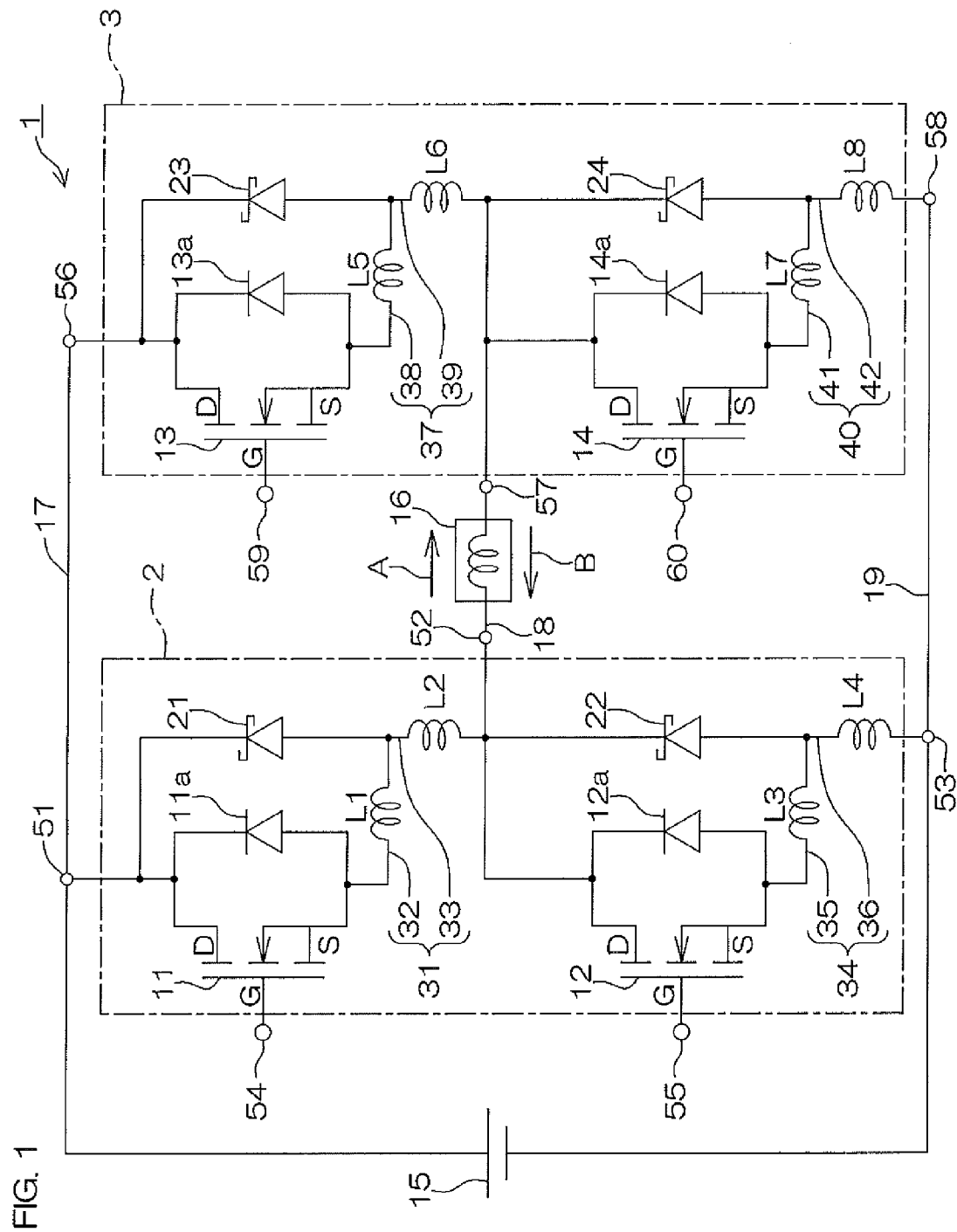
FIG. 1 is an electrical circuit diagram of an inverter circuit 1 to which a semiconductor device according to a preferred embodiment of the present invention is applied.

FIG. 1 is an electrical circuit diagram of an inverter circuit 1 to which a semiconductor device according to a preferred embodiment of the present invention is applied.

The inverter circuit 1 includes a first module 2 and a second module 3. The first module 2 includes a first power supply terminal 51, a second power supply terminal 53, two gate terminals 54 and 55, and an output terminal 52. The second module 3 includes a first power supply terminal 56, a second power supply terminal 58, two gate terminals 59 and 60, and an output terminal 57. The first power supply terminals 51 and 56 of the respective modules 2 and 3 are connected to the positive terminal of a power supply 15 (DC power supply) via a first output line 17. An inductive load 16 is connected between the output terminals 52 and 57 of the respective modules 2 and 3 via a second output line 18. The second power supply terminals 53 and 58 of the respective modules 2 and 3 are connected to the negative terminal of the power supply 15 via a third output line 19. A control unit not shown is connected to the gate terminals 54, 55, 59, and 60 of the respective modules 2 and 3.

The first module 2 includes a high-side first MOSFET 11 and a low-side second MOSFET 12 connected in series to the first MOSFET 11. The MOSFETs 11 and 12 incorporate a first PN junction diode (body diode) 11a and a second PN junction diode 12a, respectively. The PN junction diodes 11a and 12a are bipolar devices. The anodes and cathodes of the PN junction diodes 11a and 12a are connected electrically to the sources and drains of the corresponding MOSFETs 11 and 12, respectively.

A first Schottky bather diode 21 and a second Schottky barrier diode 22 serving as unipolar devices are connected in parallel to the respective MOSFETs 11 and 12. That is, the Schottky barrier diodes 21 and 22 serving as unipolar devices are connected in parallel to the PN junction diodes 11a and 12a serving as bipolar devices.

The drain of the first MOSFET 11 is connected to the first power supply terminal 51 of the first module 2. The cathode of the first Schottky barrier diode 21 is connected to the drain of the first MOSFET 11 (the cathode of the first PN junction diode 11a). The source of the first MOSFET 11 (the anode of the first PN junction diode 11a) is connected to the anode of the first Schottky barrier diode 21 via a connective metal member 32. The anode of the first Schottky barrier diode 21 is connected to the output terminal 52 of the first module 2 via a connective metal member 33. That is, the anode of the first Schottky barrier diode 21 is connected to the second output line 18 via the connective metal member 33. The connective metal members 32 and 33 include parasitic inductances L1 and L2, respectively. The connective metal members 32 and 33 are composed of a single bonding wire 31 as will hereinafter be described.

The drain of the second MOSFET 12 is connected to the output terminal 52 of the first module 2. The cathode of the second Schottky barrier diode 22 is connected to the drain of the second MOSFET 12 (the cathode of the second PN junction diode 12a). The source of the second MOSFET 12 (the anode of the second PN junction diode 12a) is connected to the anode of the second Schottky barrier diode 22 via a connective metal member 35. The anode of the second Schottky barrier diode 22 is connected to the second power supply terminal 53 of the first module 2 via a connective metal member 36. That is, the anode of the second Schottky barrier diode 22 is connected to the third output line 19 via the connective metal member 36. The connective metal members 35 and 36 include parasitic inductances L3 and L4, respectively. The connective metal members 35 and 36 are composed of a single bonding wire 34.

The second module 3 includes a high-side third MOSFET 13 and a low-side fourth MOSFET 14 connected in series to the third MOSFET 13. The MOSFETs 13 and 14 incorporate third and fourth PN junction diodes (body diodes) 13a and 14a, respectively. The PN junction diodes 13a and 14a are bipolar devices. The anodes and cathodes of the PN junction diodes 13a and 14a are connected electrically to the sources and drains of the corresponding MOSFETs 13 and 14, respectively.

Third and fourth Schottky barrier diodes 23 and 24 are connected in parallel to the respective MOSFETs 13 and 14. That is, the Schottky bather diodes 23 and 24 serving as unipolar devices are connected in parallel to the PN junction diodes 13a and 14a serving as bipolar devices.

The drain of the third MOSFET 13 is connected to the first power supply terminal 56 of the second module 3. The cathode of the third Schottky barrier diode 23 is connected to the drain of the third MOSFET 13 (the cathode of the third PN junction diode 13a). The source of the third MOSFET 13 (the anode of the third PN junction diode 13a) is connected to the anode of the third Schottky barrier diode 23 via a connective metal member 38. The anode of the third Schottky barrier diode 23 is connected to the output terminal 57 of the second module 3 via a connective metal member 39. That is, the anode of the third Schottky barrier diode 23 is connected to the second output line 18 via the connective metal member 39. The connective metal members 38 and 39 include parasitic inductances L5 and L6, respectively. The connective metal members 38 and 39 are composed of a single bonding wire 37.

The drain of the fourth MOSFET 14 is connected to the output terminal 57 of the second module 3. The cathode of the fourth Schottky barrier diode 24 is connected to the drain of the fourth MOSFET 14 (the cathode of the fourth PN junction diode 14a). The source of the fourth MOSFET 14 (the anode of the fourth PN junction diode 14a) is connected to the anode of the fourth Schottky barrier diode 24 via a connective metal member 41. The anode of the fourth Schottky barrier diode 24 is connected to the second power supply terminal 58 of the second module 3 via a connective metal member 42. That is, the anode of the fourth Schottky bather diode 24 is connected to the third output line 19 via the connective metal member 42. The connective metal members 41 and 42 include parasitic inductances L7 and L8, respectively. The connective metal members 41 and 42 are composed of a single bonding wire 40.

The first to fourth MOSFETs 11 to 14 are SiC devices prepared using a semiconductor material such as SiC (silicon carbide), an example of composite semiconductor. The forward turn-on voltage Vf1 of the Schottky bather diodes 21 to 24 is lower than the forward turn-on voltage Vf2 of the PN junction diodes 11a to 14a. The forward turn-on voltage Vf2 of the PN junction diodes 11a to 14a is, for example, 2.0 V. On the other hand, the forward turn-on voltage Vf1 of the Schottky bather diodes 21 to 24 is, for example, 1.0 V.

In the thus arranged inverter circuit 1, the first MOSFET 11 and the fourth MOSFET 14 are turned on, for example. Thereafter, the MOSFETs 11 and 14 are turned off, so that all of the MOSFETs 11 to 14 are put in an off-state. After a predetermined dead time, the second MOSFET 12 and the third MOSFET 13 are subsequently turned on. Thereafter, the MOSFETs 12 and 13 are turned off, so that all of the MOSFETs 11 to 14 are put in an off-state. After a predetermined dead time, the first MOSFET 11 and the fourth MOSFET 14 are turned on again. Such a repetitive operation drives the load 16 alternately.

When the first MOSFET 11 and the fourth MOSFET 14 are turned on, a current flows from the positive terminal of the power supply 15 through the first output line 17, the first MOSFET 11, the connective metal member 32, the connective metal member 33, the second output line 18, the load 16, the second output line 18, the fourth MOSFET 14, the connective metal member 41, and the connective metal member 42 to the third output line 19. In this case, the current flows through the load 16 in the direction indicated by the arrow A.

In this state, when all of the MOSFETs 11 to 14 are put in an off-state, the inductance of the inductive load 16 acts to maintain the current flowing through the load 16 (flowing in the direction indicated by the arrow A). This causes a current to flow from the connective metal member 36 to the third Schottky barrier diode 23 through the connective metal member 36, the second Schottky barrier diode 22, the load 16, the connective metal member 39, and the third Schottky barrier diode 23. The current thus flows through the connective metal member 36 and the connective metal member 39.

When the current thus flows through the connective metal member 36, the parasitic inductance L4 generates a back electromotive force. However, since the anode of the second PN junction diode 12a is connected to the anode of the second Schottky barrier diode 22 through the connective metal member 35, the voltage applied to the second PN junction diode 12a can only be as high as the forward turn-on voltage Vf1 of the second Schottky barrier diode 22. That is, the voltage applied to the second PN junction diode 12a cannot be equal to or higher than the forward turn-on voltage Vf2 thereof. No current can thus flow through the second PN junction diode 12a.

Similarly, when the current thus flows through the connective metal member 39, the parasitic inductance L6 generates a back electromotive force. However, since the anode of the third PN junction diode 13a is connected to the anode of the third Schottky barrier diode 23 through the connective metal member 38, the voltage applied to the third PN junction diode 13a can only be as high as the forward turn-on voltage Vf1 of the third Schottky barrier diode 23. That is, the voltage applied to the third PN junction diode 13a cannot be equal to or higher than the forward turn-on voltage Vf2 thereof. No current can thus flow through the third PN junction diode 13a.

When the second MOSFET 12 and the third MOSFET 13 are turned on, a current flows from the positive terminal of the power supply 15 through the first output line 17, the third MOSFET 13, the connective metal member 38, the connective metal member 39, the second output line 18, the load 16, the second output line 18, the second MOSFET 12, the connective metal member 35, and the connective metal member 36 to the third output line 19. In this case, the current flows through the load 16 in the direction indicated by the arrow B.

In this state, when all of the MOSFETs 11 to 14 are put in an off-state, the inductance of the inductive load 16 acts to maintain the current flowing through the load 16 (flowing in the direction indicated by the arrow B). This causes a current to flow from the connective metal member 42 to the first Schottky bather diode 21 through the connective metal member 42, the fourth Schottky bather diode 24, the load 16, the connective metal member 33, and the first Schottky barrier diode 21. The current thus flows through the connective metal member 42 and the connective metal member 33.

When the current thus flows through the connective metal member 42, the parasitic inductance L8 generates a back electromotive force. However, since the anode of the fourth PN junction diode 14a is connected to the anode of the fourth Schottky barrier diode 24 through the connective metal member 41, the voltage applied to the fourth PN junction diode 14a can only be as high as the forward turn-on voltage Vf1 of the fourth Schottky barrier diode 24. That is, the voltage applied to the fourth PN junction diode 14a cannot be equal to or higher than the forward turn-on voltage Vf2 thereof. No current can thus flow through the fourth PN junction diode 14a.

Similarly, when the current thus flows through the connective metal member 33, the parasitic inductance L2 generates a back electromotive force. However, since the anode of the first PN junction diode 11a is connected to the anode of the first Schottky barrier diode 21 through the connective metal member 32, the voltage applied to the first PN junction diode 11a can only be as high as the forward turn-on voltage Vf1 of the first Schottky barrier diode 21. That is, the voltage applied to the first PN junction diode 11a cannot be equal to or higher than the forward turn-on voltage Vf2 thereof. No current can thus flow through the first PN junction diode 11a.

It is thus possible to prevent a current from flowing through the PN junction diodes 11a to 14a incorporated in the respective MOSFETs 11 to 14 during the dead time. This can prevent forward degradation of the MOSFETs 11 to 14.

Next will be described the internal structure of the modules 2 and 3 shown in FIG. 1.

Figure 2:
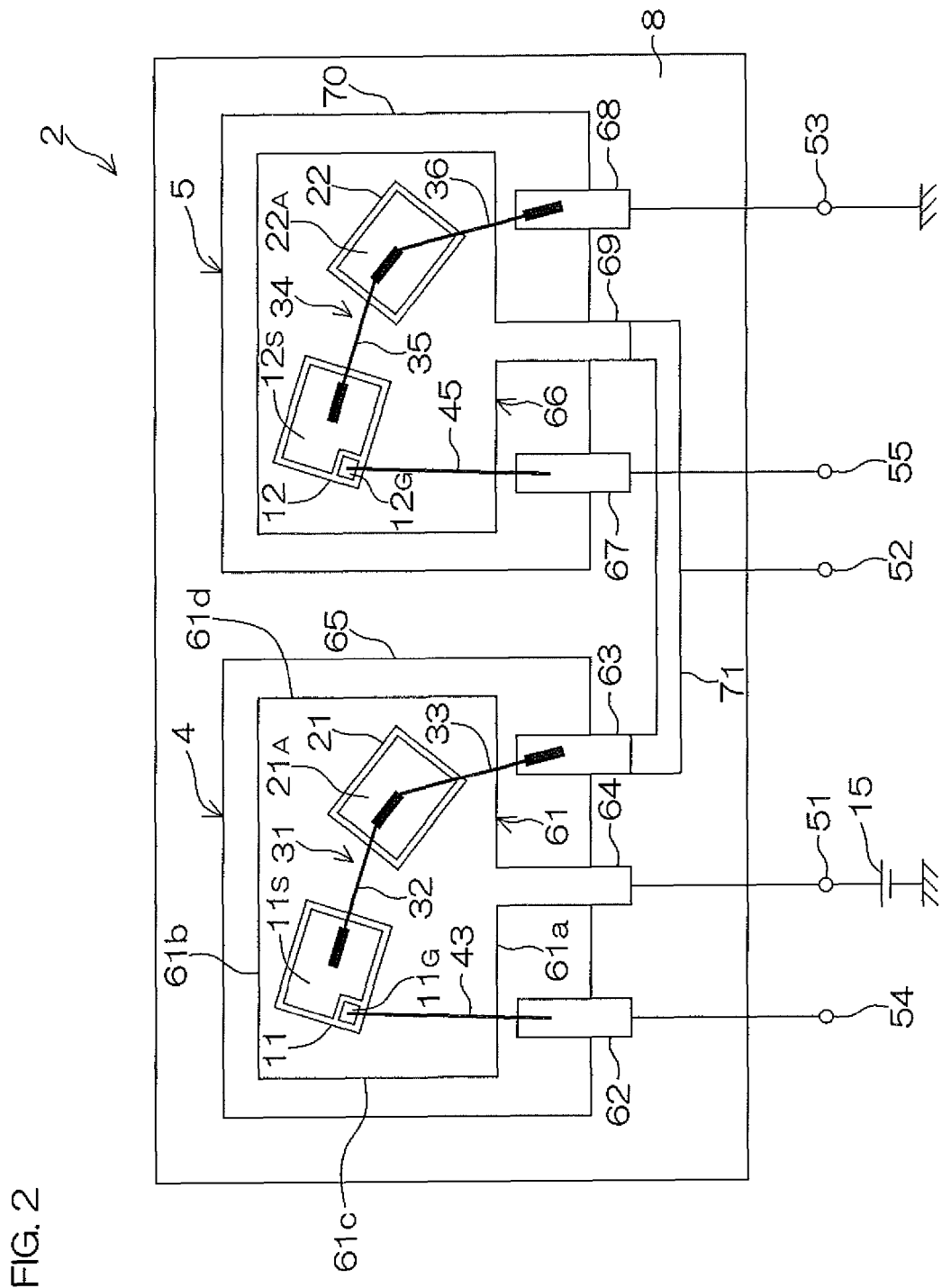
FIG. 2 is a schematic plan view showing the internal structure of the module shown in FIG. 1.
Figure 3:
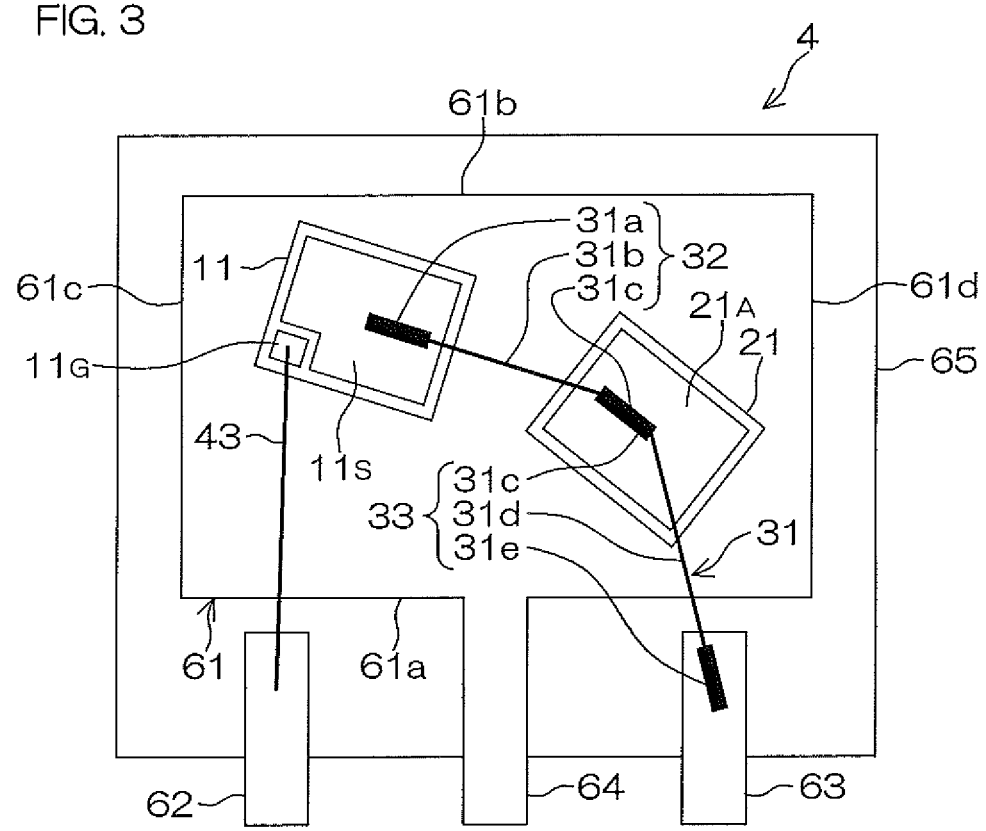
FIG. 3 is an enlarged plan view of the package 4 shown in FIG. 2.
Figure 4:
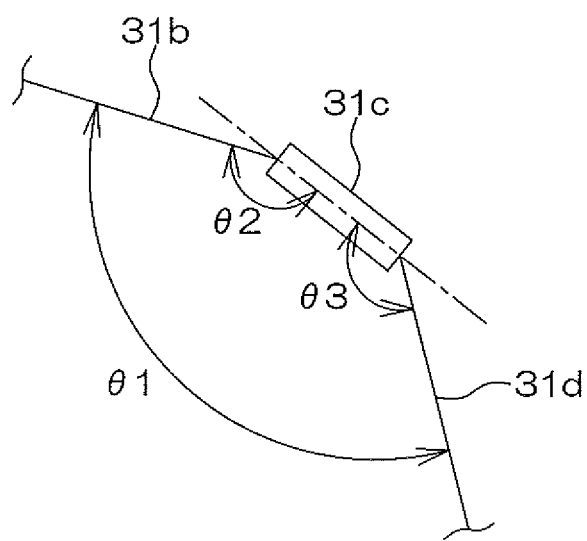
FIG. 4 is a partially enlarged plan view of FIG. 3.
Figure 5:
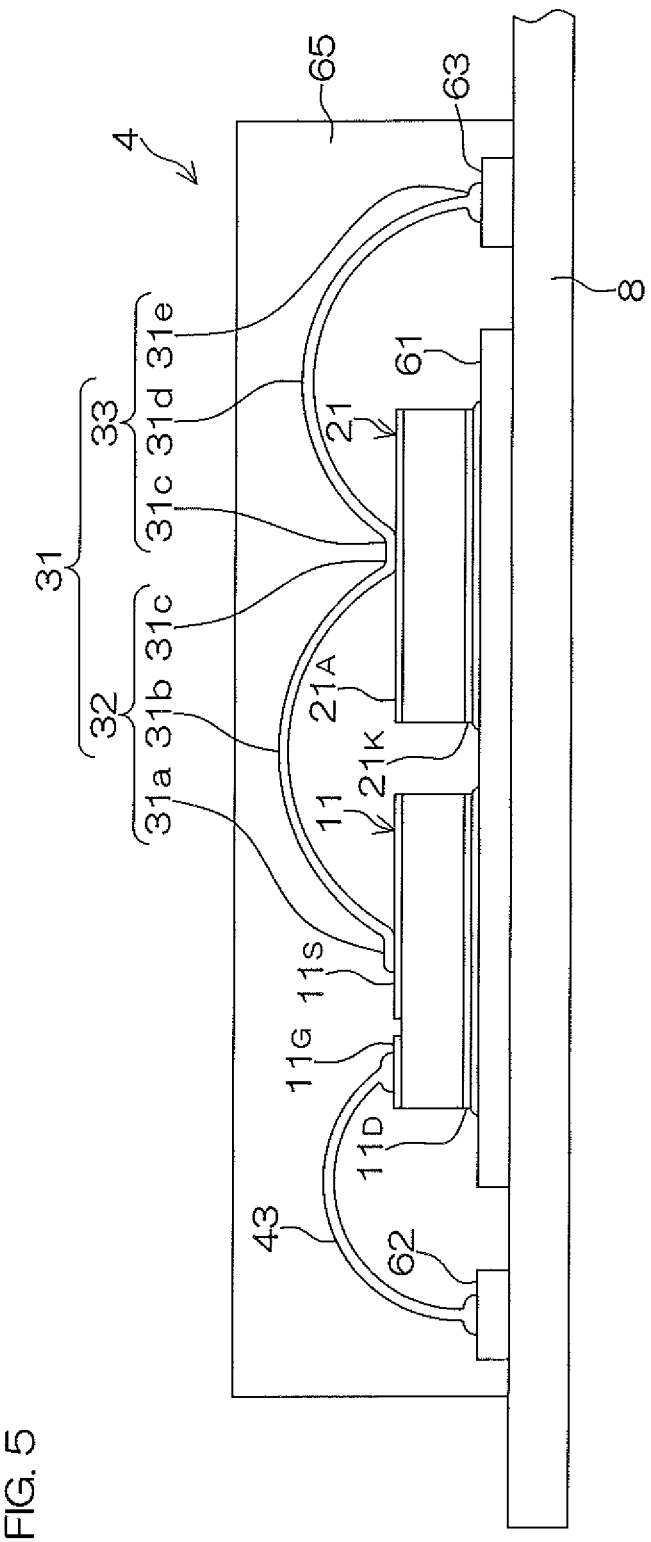
FIG. 5 is a schematic side view showing the internal structure of the package 4 shown in FIG. 2.

FIG. 2 is a schematic plan view showing the internal structure of the module 2 shown in FIG. 1. FIG. 3 is an enlarged plan view of the package 4 shown in FIG. 2. FIG. 4 is a partially enlarged plan view of FIG. 3. FIG. 5 is a schematic side view showing the internal structure of the package 4 shown in FIG. 2.

The module 2 includes an insulating substrate 8, two packages 4 and 5 fixed on the insulating substrate 8, and a case (not shown) fixed on a surface of the insulating substrate 8 to house the two packages 4 and 5 therein. The insulating substrate 8 is formed in a rectangular shape in a plan view elongated laterally in FIG. 2. The packages 4 and 5 are each formed in a rectangular shape in a plan view elongated laterally in FIG. 2. The two packages 4 and 5 are disposed side by side in the longitudinal direction of the insulating substrate 8.

The arrangement of the package 4 will be described with reference to FIGS. 2 to 5. In the following description, "front" represents the lower side in FIG. 3, "rear" represents the upper side in FIG. 3, "left" represents the left side in FIG. 3, and "right" represents the right side in FIG. 3.

The package 4 includes a die pad 61, a gate lead 62, a source lead (conductive member) 63, the first MOSFET 11, the first Schottky bather diode 21, and a molding resin 65 encapsulating these components therein. The die pad 61 has an approximately rectangular shape elongated laterally in a plan view, having a pair of long sides 61a and 61b and a pair of short sides 61c and 61d. The first MOSFET 11 and the first Schottky barrier diode 21 each have a rectangular shape in a plan view.

The die pad 61 has a lead portion (hereinafter referred to as "drain lead 64") protruding forward from approximately the center of the front long side (first side) 61a. The leading end of the drain lead 64 protrudes out of the molding resin 65. The gate lead 62 and the source lead 63 are disposed on either side of and parallel with the drain lead 64. In a plan view, the gate lead 62 is disposed in a manner opposed to a portion near the left end of the front long side 61a of the die pad 61, while the source lead 63 is disposed in a manner opposed to a portion near the right end of the front long side 61a of the die pad 61. One end of the gate lead 62 and the source lead 63 protrudes out of the molding resin 65. The die pad 61, the gate lead 62, and the source lead 63 are each composed of, for example, a copper or aluminum plate-like body.

On a surface of the die pad 61, the first MOSFET 11 and the first Schottky barrier diode 21 are disposed in such a manner that the first Schottky barrier diode 21 is positioned obliquely forward to the right from the first MOSFET 11 in a plan view. That is, the first Schottky barrier diode 21 is disposed at a position closer to the right short side (second side) 61d and the front long side 61a of the die pad 61 than the first MOSFET 11.

The first MOSFET 11 is disposed at a posture rotated, from a posture in which the four sides of the first MOSFET 11 are parallel, respectively, with the four sides 61a to 61d of the die pad 61 in a plan view, by a first required angle with respect to the die pad 61 such that the corresponding opposed sides of the first MOSFET 11 and the die pad 61 are not parallel with each other. The long sides of the first MOSFET 11 are inclined, in a plan view, with respect to the long sides 61a and 61b of the die pad 61 in a manner coming close to the front long side 61a of the die pad 61 so as to come close to the right short side 61d of the die pad 61. The long sides of the first MOSFET 11 also extend toward the intersection between the right short side 61d and the front long side 61a of the die pad 61.

Similarly, the first Schottky barrier diode 21 is disposed at a posture rotated, from a posture in which the four sides of the first Schottky barrier diode 21 are parallel, respectively, with the four sides 61a to 61d of the die pad 61 in a plan view, by a second required angle with respect to the die pad 61 such that the corresponding opposed sides of the first Schottky barrier diode 21 and the die pad 61 are not parallel with each other. The long sides of the first Schottky barrier diode 21 are inclined, in a plan view, with respect to the long sides 61a and 61b of the die pad 61 in a manner coming close to the front long side 61a of the die pad 61 so as to come close to the right short side 61d of the die pad 61. The long sides of the first Schottky barrier diode 21 also extend toward the intersection between the right short side 61d and the front long side 61a of the die pad 61. The angle of inclination of the long sides of the first Schottky barrier diode 21 with respect to the long sides 61a and 61b of the die pad 61 is greater than the angle of inclination of the long sides of the first MOSFET 11 with respect to the long sides 61a and 61b of the die pad 61.

The first MOSFET 11 and the first Schottky barrier diode 21 are die-bonded to the surface of the die pad 61. The first MOSFET 11 has a drain electrode (drain pad) $11_D$ on a surface opposed to the die pad 61, the drain electrode $11_D$ being bonded to the die pad 61 with conductive brazing metal. The first MOSFET 11 also has a source electrode (source pad) $11_S$ and a gate electrode (gate pad) $11_G$ on the surface opposite to the surface die-bonded to the die pad 61.

The source electrode $11_S$ has an approximately rectangular shape in a plan view and is formed to cover almost all of the surface of the first MOSFET 11. In a plan view, the length of the long sides of the source electrode $11_S$ is, for example, about 1.7 mm, while the length of the short sides of the source electrode $11_S$ is, for example, about 1.5 mm. The front left corner of the source electrode $11_S$ is removed to form a region having an approximately square shape in a plan view. In the removed region, the source electrode $11_S$ is not formed. The gate electrode $11_G$ is disposed in the removed region.

That is, the gate electrode $11_G$ is disposed at one of the four corners on the surface of the first MOSFET 11 farthest from the right short side 61d of the die pad 61. The gate electrode $11_G$ is thus disposed at the corner farther from the right short side 61d of the die pad 61 but closer to the front long side 61a of the die pad 61. The gate electrode $11_G$ has an approximately square shape in a plan view and the length of each side is, for example, about 600 μm.

The first Schottky barrier diode 21 has a cathode electrode (cathode pad) $21_K$ on a surface opposed to the die pad 61, the cathode electrode $21_K$ being bonded to the die pad 61 with conductive brazing metal. The first Schottky barrier diode 21 also has an anode electrode (anode pad) $21_A$ on the surface opposite to the surface die-bonded to the die pad 61. The anode electrode $21_A$ has an approximately rectangular shape in a plan view and is formed to cover almost all of the surface of the first Schottky barrier diode 21. In a plan view, the length of the long sides of the anode electrode $21_A$ is about 1.5 mm, while the length of the short sides of the anode electrode $21_A$ is about 1.4 mm.

The gate electrode $11_G$ of the first MOSFET 11 is connected electrically to the gate lead 62 through a bonding wire 43. The connection is achieved by, for example, ball bonding using an Au wire with a diameter of about 25 to 75 μm or wedge bonding using an Al wire with a diameter of about 50 to 150 μm.

The source electrode $11_S$ of the first MOSFET 11, the anode electrode $21_A$ of the first Schottky barrier diode 21, and the source lead 63 are bonded electrically to each other via a bonding wire 31, one end of which is bonded to the source electrode $11_S$ of the first MOSFET 11, the other end of which is bonded to the source lead 63, and the center of which is bonded to the anode electrode $21_A$ of the first Schottky barrier diode 21. The connections are achieved by wedge bonding.

More specifically, the connections are achieved by stitch bonding starting from one of the source electrode $11_S$ of the first MOSFET 11 and the source lead 63 through the anode electrode $21_A$ of the first Schottky barrier diode 21 to end at the other of the source electrode $11_S$ of the first MOSFET 11 and the source lead 63.

The portion of the bonding wire 31 bonded to the source electrode $11_S$ of the first MOSFET 11 will hereinafter be referred to as first bonded portion 31a, the portion bonded to the anode electrode $21_A$ of the first Schottky barrier diode 21 will hereinafter be referred to as second bonded portion 31c, and the portion bonded to the source lead 63 will hereinafter be referred to as third bonded portion 31e. In addition, the portion of the bonding wire 31 between the first bonded portion 31a and the second bonded portion 31c will hereinafter be referred to as first wire portion 31b, and the portion between the second bonded portion 31c and the third bonded portion 31e will hereinafter be referred to as second wire portion 31d.

The source electrode $11_S$ of the first MOSFET 11 and the anode electrode $21_A$ of the first Schottky barrier diode 21 are connected electrically to each other through the portion (connective metal member) 32 of the entire length of the bonding wire 31, including the first bonded portion 31a, the first wire portion 31b, and the second bonded portion 31c. The anode electrode $21_A$ of the first Schottky barrier diode 21 and the source lead 63 are connected electrically to each other through the portion (connective metal member) 33 of the entire length of the bonding wire 31, including the second bonded portion 31c, the second wire portion 31d, and the third bonded portion 31e.

The bonding wire 31 is, for example, an Al wire with a diameter of about 250 to 400 μm. The bonded portions 31a, 31c, and 31e each have an approximately rectangular shape in a plan view elongated in the length direction of the bonding wire 31 and have a longitudinal length about four times the diameter of the bonding wire 31 (about 1 to 1.6 mm), while having a width length about two times the diameter of the bonding wire 31 (about 0.5 to 0.8 mm). Accordingly, the size of the bonded portion 31a relative to the source electrode $11_S$ of the first MOSFET 11 and the size of the second bonded portion 31c relative to the anode electrode $21_A$ of the first Schottky barrier diode 21 are actually larger than those shown in FIG. 3.

The first bonded portion 31a of the bonding wire 31 is bonded to the source electrode $11_S$ of the first MOSFET 11 in a state where the longitudinal direction of the first bonded portion 31a is parallel, in a plan view, with the long sides of the first MOSFET 11 (the long sides of the source electrode $11_S$). It is therefore possible to increase the bonding area between the bonding wire 31 and the source electrode $11_S$ and therefore the bonding strength between the bonding wire 31 and the source electrode $11_S$ can be increased.

The reason for this will be described. During bonding of the bonding wire 31 to the source electrode $11_S$ by stitch bonding, the portion of the bonding wire 31 to be bonded to the source electrode $11_S$ is pressed against the source electrode $11_S$ by a wedge tool and heated to thereby be flattened. In this case, if the flattened portion of the bonding wire 31 partially ran off the surface of the source electrode $11_S$, the bonding area between the bonding wire 31 and the source electrode $11_S$ would decrease. In this preferred embodiment, the flattened portion of the bonding wire 31 is bonded to the source electrode $11_S$ in a state where the longitudinal direction of the flattened portion is parallel with the long sides of the first MOSFET 11, which can prevent or reduce such partial run-off of the flattened portion from the surface of the source electrode $11_S$. It is therefore possible to increase the bonding area between the bonding wire 31 and the source electrode $11_S$.

The second bonded portion 31c of the bonding wire 31 is bonded to the anode electrode $21_A$ of the first Schottky barrier diode 21 in a state where the longitudinal direction of the second bonded portion 31c is parallel with the long sides of the Schottky barrier diode 21 (the long sides of the anode electrode $21_A$). It is therefore possible to increase the bonding area between the bonding wire 31 and the anode electrode $21_A$ and therefore the bonding strength between the bonding wire 31 and the anode electrode $21_A$ can be increased.

As mentioned above, the source lead 63 is disposed in a manner opposed to a portion near the right end of the front long side 61a of the die pad 61. The first Schottky barrier diode 21 is disposed at a position closer to the right short side 61d and the front long side 61a of the die pad 61 than the first MOSFET 11.

This allows the angle θ1 (the narrower; the same applies hereinafter) between the first wire portion 31b and the second wire portion 31d to be great in a plan view, as shown in FIG. 4. Specifically, the angle θ1 can be 90 degrees or more. The angle θ2 between the first wire portion 31b and the second bonded portion 31c and the angle θ3 between the second wire portion 31d and the second bonded portion 31c are each also 90 degrees or more in a plan view. The connection between the first wire portion 31b and the second bonded portion 31c as well as the connection between the second wire portion 31d and the second bonded portion 31c are likely to be under load, but the angles θ1, θ2, and θ3 are 90 degrees or more, whereby it is possible for the connections to have increased strength.

Also in this preferred embodiment, the first wire portion 31b is shorter than the second wire portion 31d and the angle θ2 is greater than the angle θ3. Since the first wire portion 31b is shorter than the second wire portion 31d, the first wire portion 31b is less likely to absorb an external force such as a pulling force, if applied thereto, than the second wire portion 31d. Hence, the angle θ2 is made greater than the angle θ3, so that the strength of the connection between the first wire portion 31b and the second bonded portion 31c is higher than the strength of the connection between the second wire portion 31d and the second bonded portion 31c.

Referring again to FIG. 2, the package 5 includes a die pad 66 having a lead portion (drain lead 69), a gate lead 67, a source lead 68, the second MOSFET 12, the second Schottky barrier diode 22, and a molding resin 70 encapsulating these components therein. The internal structure of the package 5, which is the same as the internal structure of the package 4, will not be described in detail.

In addition, in the package 5, the sign 45 denotes a bonding wire for electrically connecting the gate electrode $12_G$ of the second MOSFET 12 to the gate lead 67, corresponding to the bonding wire 43 in the package 4. The sign 34 denotes a bonding wire for electrically connecting the source electrode $12_S$ of the second MOSFET 12, the anode electrode $22_A$ of the second Schottky bather diode 22, and the source lead 68, corresponding to the bonding wire 31 in the package 4.

The source lead 63 of the package 4 and the drain lead 69 of the package 5 are connected electrically to each other through a strip-like metal pattern 71 having a U shape in a plan view. The metal pattern 71 is composed of, for example, copper or aluminum thin film wiring and formed on the surface of the insulating substrate 8.

The gate lead 62 of the package 4 is connected to a gate terminal 54. The gate terminal 54 is on the outside of the case of the module 2. The drain lead 64 of the package 4 is connected to the first power supply terminal 51. The first power supply terminal 51 is on the outside of the case of the module 2. The first power supply terminal 51 is connected with the power supply 15. The metal pattern 71 is connected to the output terminal 52. The output terminal 52 is on the outside of the case of the module 2.

The gate lead 67 of the package 5 is connected to a gate terminal 55. The gate terminal 55 is on the outside of the case of the module 2. The source lead 68 of the package 5 is connected to the second power supply terminal 53. The second power supply terminal 53 is on the outside of the case of the module 2. The second power supply terminal 53 is grounded (connected to the negative terminal of the power supply 15).

The internal structure of the second module 3, which is the same as the internal structure of the first module 2, will not be described.

Figure 6:
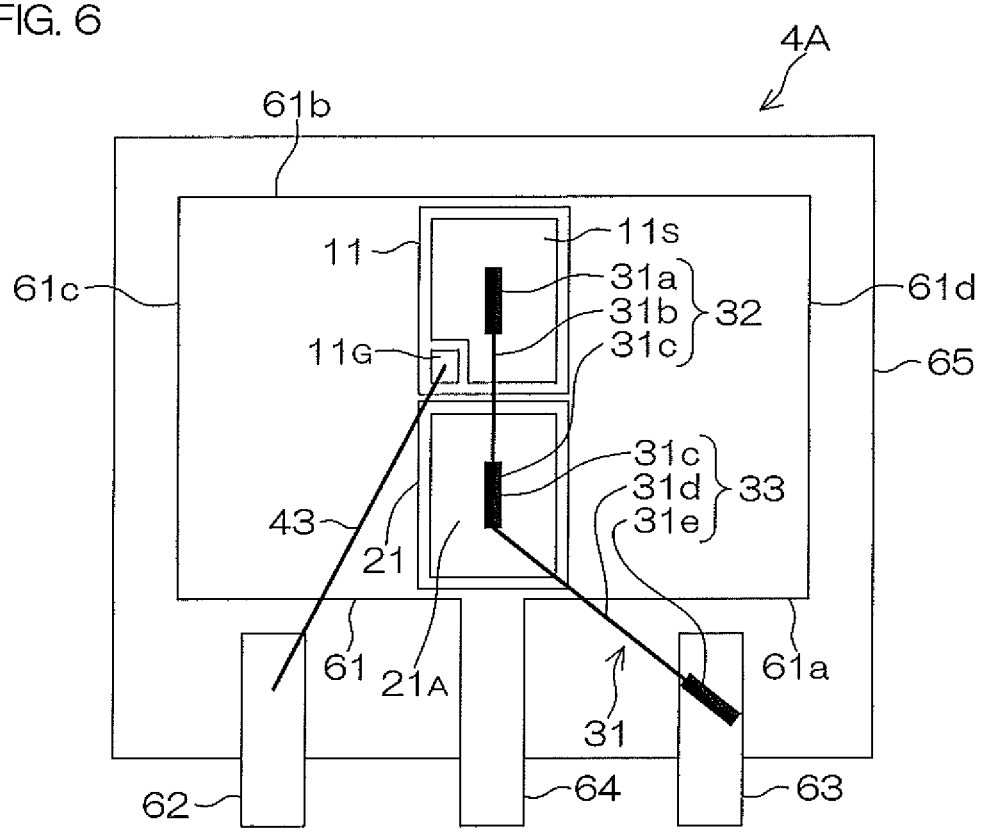
FIG. 6 is a schematic plan view showing a first exemplary variation of the package 4.

FIG. 6 is a schematic plan view showing a first exemplary variation of the package 4. In FIG. 6, components corresponding to those in FIG. 3 are designated by the same signs in FIG. 3. In the following description, "front" represents the lower side in FIG. 6, "rear" represents the upper side in FIG. 6, "left" represents the left side in FIG. 6, and "right" represents the right side in FIG. 6.

In the package 4A according to the first exemplary variation, the first MOSFET 11 and the first Schottky bather diode 21 are disposed differently from the package 4 shown in FIG. 3.

The first MOSFET 11 and the first Schottky barrier diode 21 are disposed side by side in the anteroposterior direction in the width center of the die pad 61 in a plan view. The first Schottky barrier diode 21 is disposed in front of the first MOSFET 11.

The first MOSFET 11 has a rectangular shape in a plan view and is disposed such that the long sides thereof are parallel with the right short side 61d of the die pad 61. Similarly, the first Schottky barrier diode 21 has a rectangular shape in a plan view and is disposed such that the long sides thereof are parallel with the right short side 61d of the die pad 61.

The gate electrode (gate pad) $11_G$ of the first MOSFET 11 is disposed at the front left corner on the surface of the first MOSFET 11. That is, the gate electrode $11_G$ is disposed at one of the four corners on the surface of the first MOSFET 11 farther from the right short side 61d but closer to the front long side 61a of the die pad 61. The gate electrode $11_G$ of the first MOSFET 11 is connected electrically to the gate lead 62 through the bonding wire 43.

The source electrode $11_S$ of the first MOSFET 11, the anode electrode $21_A$ of the first Schottky barrier diode 21, and the source lead 63 are bonded electrically to each other through the bonding wire 31, one end of which is bonded to the source electrode $11_S$ of the first MOSFET 11, the other end of which is bonded to the source lead 63, and the center of which is bonded to the anode electrode $21_A$ of the first Schottky bather diode 21. The connections are achieved by stitch bonding.

The portion of the bonding wire 31 bonded to the source electrode $11_S$ of the first MOSFET 11 will hereinafter be referred to as first bonded portion 31a, the portion bonded to the anode electrode $21_A$ of the first Schottky barrier diode 21 will hereinafter be referred to as second bonded portion 31c, and the portion bonded to the source lead 63 will hereinafter be referred to as third bonded portion 31e. In addition, the portion of the bonding wire 31 between the first bonded portion 31a and the second bonded portion 31c will hereinafter be referred to as first wire portion 31b, and the portion between the second bonded portion 31c and the third bonded portion 31e will hereinafter be referred to as second wire portion 31d.

The source electrode $11_S$ of the first MOSFET 11 and the anode electrode $21_A$ of the first Schottky barrier diode 21 are connected electrically to each other through the portion (connective metal member) 32 of the entire length of the bonding wire 31, including the first bonded portion 31a, the first wire portion 31b, and the second bonded portion 31c. The anode electrode $21_A$ of the first Schottky barrier diode 21 and the source lead 63 are connected electrically to each other through the portion (connective metal member) 33 of the entire length of the bonding wire 31, including the second bonded portion 31c, the second wire portion 31d, and the third bonded portion 31e.

The first bonded portion 31a of the bonding wire 31 is bonded to the source electrode $11_S$ of the first MOSFET 11 in a state where the longitudinal direction of the first bonded portion 31a is parallel, in a plan view, with the long sides of the first MOSFET 11 (the long sides of the source electrode $11_S$). It is therefore possible to increase the bonding area between the bonding wire 31 and the source electrode $11_S$ and therefore the bonding strength between the bonding wire 31 and the source electrode $11_S$ can be increased.

The second bonded portion 31c of the bonding wire 31 is bonded to the anode electrode $21_A$ of the first Schottky barrier diode 21 in a state where the longitudinal direction of the second bonded portion 31c is parallel with the long sides of the Schottky barrier diode 21 (the long sides of the anode electrode $21_A$). It is therefore possible to increase the bonding area between the bonding wire 31 and the anode electrode $21_A$ and therefore the bonding strength between the bonding wire 31 and the anode electrode $21_A$ can be increased.

The angle between the first wire portion 31b and the second wire portion 31d is 90 degrees or more in a plan view. The angle between the first wire portion 31b and the second bonded portion 31c is also 90 degrees or more (180 degrees in this example) in a plan view. The angle between the second wire portion 31d and the second bonded portion 31c is also 90 degrees or more in a plan view. The connection between the first wire portion 31b and the second bonded portion 31c as well as the connection between the second wire portion 31d and the second bonded portion 31c are likely to be under load, but the angles are 90 degrees or more, whereby it is possible for the connections to have increased strength.

In addition, the first wire portion 31b is shorter than the second wire portion 31d, and the angle between the first wire portion 31b and the second bonded portion 31c is greater than the angle between the second wire portion 31d and the second bonded portion 31c in a plan view. The strength of the connection between the first wire portion 31b, which is shorter, and the second bonded portion 31c is thus higher than the strength of the connection between the second wire portion 31d, which is longer, and the second bonded portion 31c.

Figure 7:
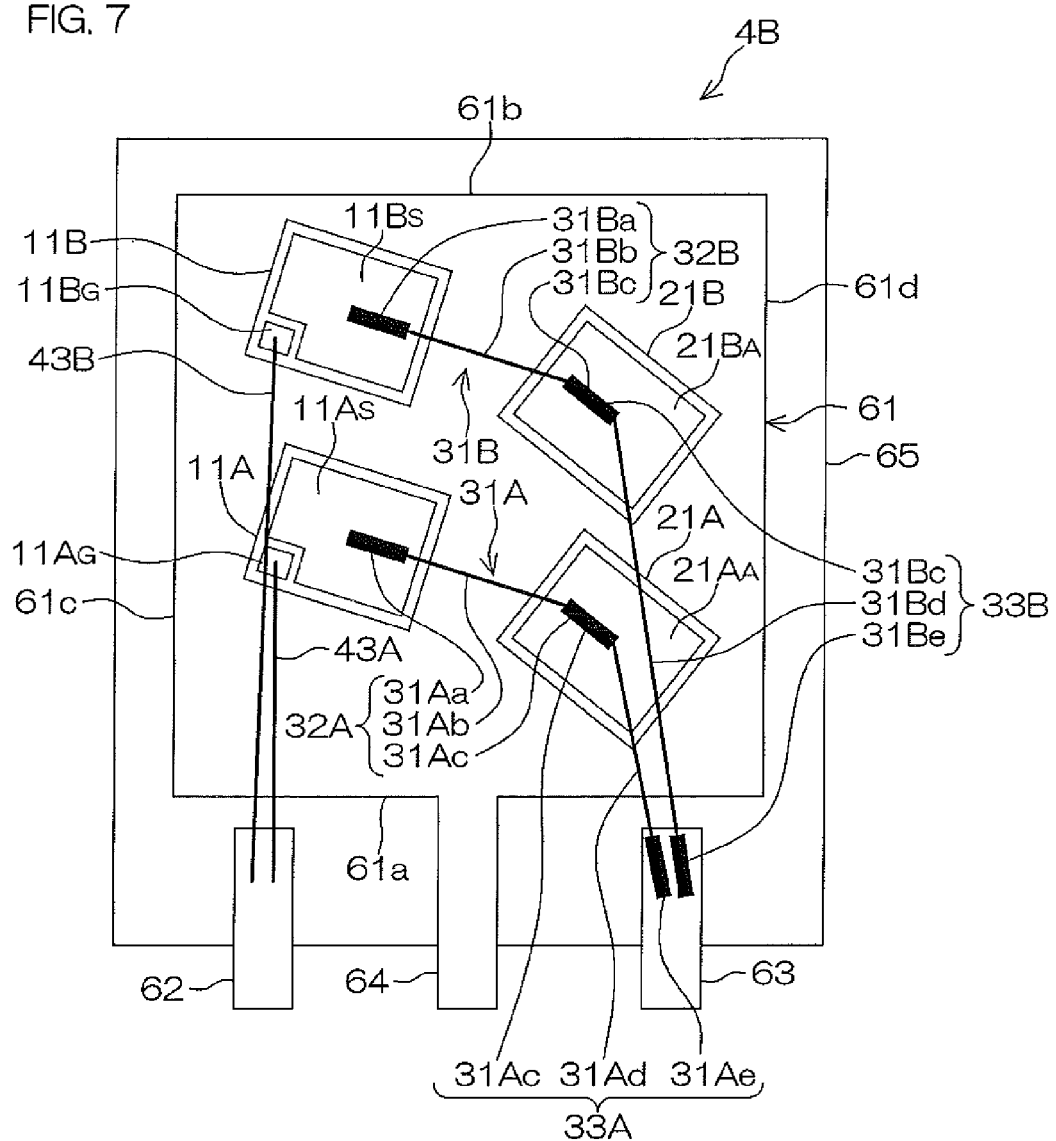
FIG. 7 is a schematic plan view showing a second exemplary variation of the package 4.
Figure 8:
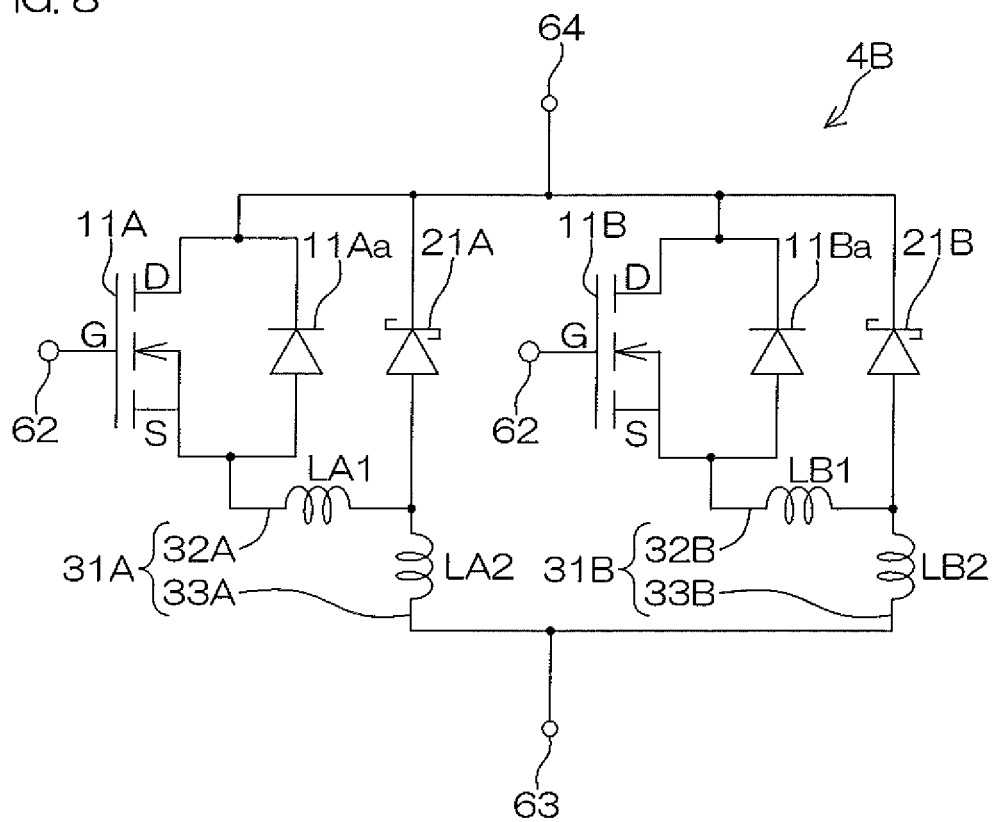
FIG. 8 is an electrical circuit diagram showing the electrical configuration of the second exemplary variation of the package 4.

FIG. 7 is a schematic plan view showing a second exemplary variation of the package 4. FIG. 8 is an electrical circuit diagram showing the electrical configuration of the second exemplary variation of the package 4.

The package 4B according to the second exemplary variation includes two sets of the first MOSFET 11 and the first Schottky barrier diode 21 of the package 4 shown in FIG. 3. The sets are then connected in parallel to each other.

The electrical configuration of the package 4B according to the second exemplary variation will be described with reference to FIG. 8.

The package 4B includes a drain lead terminal (drain lead) 64, a source lead terminal (source lead) 63, a gate lead terminal (gate lead) 62, two first MOSFETs 11A and 11B, and two first Schottky bather diodes 21A and 21B. The first MOSFETs 11A and 11B incorporate first PN junction diodes (body diodes) 11Aa and 11Ba, respectively. The anodes and cathodes of the first PN junction diodes 11Aa and 11Ba are connected electrically to the sources and drains of the corresponding first MOSFETs 11A and 11B, respectively.

First Schottky barrier diodes 21A and 21B are connected in parallel to the respective first MOSFETs 11A and 11B. The drains of the first MOSFETs 11A and 11B are connected to the drain lead terminal 64. The cathodes of the first Schottky barrier diodes 21A and 21B are connected to the drains of the respective first MOSFETs 11A and 11B (the cathodes of the first PN junction diodes 11Aa and 11Ba). The sources of the first MOSFETs 11A and 11B (the anodes of the first PN junction diodes 11Aa and 11Ba) are connected to the anodes of the respective first Schottky barrier diodes 21A and 21B via connective metal members 32A and 32B, respectively. The anodes of the first Schottky barrier diodes 21A and 21B are connected to the source lead terminal 63 via connective metal members 33A and 33B, respectively. The connective metal members 32A, 32B, 33A, and 33B include parasitic inductances LA1, LB1, LA2, and LB2, respectively. The connective metal members 32A and 33A are composed of a single bonding wire 31A as will hereinafter be described. The connective metal members 32B and 33B are composed of a single bonding wire 31B as will hereinafter be described.

The gates of the first MOSFETs 11A and 11B are connected to the gate lead terminal 62.

The internal structure of the package 4B will be described with reference to FIG. 7. In the following description, "front" represents the lower side in FIG. 7, "rear" represents the upper side in FIG. 7, "left" represents the left side in FIG. 7, and "right" represents the right side in FIG. 7.

The package 4B includes a die pad 61, the gate lead 62, the source lead 63, the two first MOSFETs 11A and 11B, the two first Schottky bather diodes 21A and 21B, and a molding resin 65 encapsulating these components therein. The die pad 61 has an approximately square shape in a plan view, having a pair of laterally extending sides 61a and 61b and a pair of anteroposteriorly extending sides 61c and 61d. The first MOSFETs 11A and 11B and the first Schottky bather diodes 21A and 21B each have a rectangular shape in a plan view.

The die pad 61 has a lead portion (hereinafter referred to as "drain lead 64") protruding forward from approximately the center of the front side 61a. The leading end of the drain lead 64 protrudes out of the molding resin 65. The gate lead 62 and the source lead 63 are disposed on either side of and parallel with the drain lead 64. In a plan view, the gate lead 62 is disposed in a manner opposed to a portion near the left end of the front side 61a of the die pad 61, while the source lead 63 is disposed in a manner opposed to a portion near the right end of the front side 61a of the die pad 61. One end of the gate lead 62 and the source lead 63 protrudes out of the molding resin 65. The die pad 61, the gate lead 62, and the source lead 63 are each composed of, for example, a copper or aluminum plate-like body.

The first MOSFETs 11A and 11B and the first Schottky bather diodes 21A and 21B are disposed on a surface of the die pad 61. The first MOSFET 11A and the corresponding first Schottky barrier diode 21A are disposed in such a manner that the first Schottky bather diode 21A is positioned obliquely forward to the right from the first MOSFET 11A in a plan view. That is, the first Schottky barrier diode 21A is disposed at a position closer to the right side 61d and the front side 61a of the die pad 61 than the first MOSFET 11A.

On the other hand, the first MOSFET 11B and the first Schottky bather diode 21B are disposed, respectively, at the rear of the first MOSFET 11A and the first Schottky bather diode 21A. The first MOSFET 11B and the corresponding first Schottky barrier diode 21B are disposed in such a manner that the first Schottky bather diode 21B is positioned obliquely forward to the right from the first MOSFET 11B in a plan view. That is, the first Schottky barrier diode 21B is disposed at a position closer to the right side 61$d$ and the front side 61$a$ of the die pad 61 than the first MOSFET 11B.

The first MOSFETs 11A and 11B are disposed at a posture rotated, from a posture in which the four sides of the first MOSFETs 11A and 11B are parallel, respectively, with the four sides 61$a$ to 61$d$ of the die pad 61 in a plan view, by a first required angle with respect to the die pad 61 such that the corresponding opposed sides of the first MOSFETs 11A and 11B and the die pad 61 are not parallel with each other. The long sides of the first MOSFETs 11A and 11B are inclined, in a plan view, with respect to the front and rear sides 61$a$ and 61$b$ of the die pad 61 in a manner coming close to the front side 61$a$ of the die pad 61 so as to come close to the right side 61$d$ of the die pad 61.

Similarly, the first Schottky barrier diodes 21A and 21B are disposed at a posture rotated, from a posture in which the four sides of the first Schottky barrier diodes 21A and 21B are parallel, respectively, with the four sides 61$a$ to 61$d$ of the die pad 61 in a plan view, by a second required angle with respect to the die pad 61 such that the corresponding opposed sides of the first Schottky barrier diodes 21A and 21B and the die pad 61 are not parallel with each other. The long sides of the first Schottky barrier diodes 21A and 21B are inclined, in a plan view, with respect to the front and rear sides 61$a$ and 61$b$ of the die pad 61 in a manner coming close to the front side 61$a$ of the die pad 61 so as to come close to the right side 61$d$ of the die pad 61. The angle of inclination of the long sides of the first Schottky barrier diodes 21A and 21B with respect to the long sides 61$a$ and 61$b$ of the die pad 61 is greater than the angle of inclination of the long sides of the first MOSFETs 11A and 11B with respect to the long sides 61$a$ and 61$b$ of the die pad 61.

The first MOSFETs 11A and 11B and the first Schottky barrier diodes 21A and 21B are die-bonded to the surface of the die pad 61. The first MOSFETs 11A and 11B each have a drain electrode (drain pad) on a surface opposed to the die pad 61, the drain electrode being bonded to the die pad 61 with conductive brazing metal. Also, the first MOSFETs 11A and 11B each have a source electrode (source pad) 11$A_S$ or 11$B_S$ and a gate electrode (gate pad) 11$A_G$ or 11$B_G$ on the surface opposite to the surface die-bonded to the die pad 61. The gate electrodes 11$A_G$ and 11$B_G$ are disposed at the front left corner on the surface of the respective first MOSFETs 11A and 11B.

The first Schottky barrier diodes 21A and 21B each have a cathode electrode (cathode pad) on a surface opposed to the die pad 61, the cathode electrode being bonded to the die pad 61 with conductive brazing metal. Also, the first Schottky bather diodes 21A and 21B each have an anode electrode (anode pad) 21$A_A$ or 21$B_A$ on the surface opposite to the surface die-bonded to the die pad 61.

The gate electrode 11$A_G$ of the first MOSFET 11A is connected electrically to the gate lead 62 through a bonding wire 43A.

The source electrode 11$A_S$ of the first MOSFET 11A, the anode electrode 21$A_A$ of the corresponding first Schottky bather diode 21A, and the source lead 63 are bonded electrically to each other through the bonding wire 31A, one end of which is bonded to the source electrode 11$A_S$ of the first MOSFET 11A, the other end of which is bonded to the source lead 63, and the center of which is bonded to the anode electrode 21$A_A$ of the first Schottky barrier diode 21A. The connections are achieved by stitch bonding.

The portion of the bonding wire 31A bonded to the source electrode 11$A_S$ of the first MOSFET 11A will hereinafter be referred to as first bonded portion 31Aa, the portion bonded to the anode electrode 21$A_A$ of the first Schottky barrier diode 21A will hereinafter be referred to as second bonded portion 31Ac, and the portion bonded to the source lead 63 will hereinafter be referred to as third bonded portion 31Ae. In addition, the portion of the bonding wire 31A between the first bonded portion 31Aa and the second bonded portion 31Ac will hereinafter be referred to as first wire portion 31Ab, and the portion between the second bonded portion 31Ac and the third bonded portion 31Ae will hereinafter be referred to as second wire portion 31Ad.

The source electrode 11$A_S$ of the first MOSFET 11A and the anode electrode 21$A_A$ of the first Schottky barrier diode 21A are connected electrically to each other through the portion (connective metal member) 32A of the entire length of the bonding wire 31A, including the first bonded portion 31Aa, the first wire portion 31Ab, and the second bonded portion 31Ac. The anode electrode 21$A_A$ of the first Schottky barrier diode 21A and the source lead 63 are connected electrically to each other through the portion (connective metal member) 33A of the entire length of the bonding wire 31A, including the second bonded portion 31Ac, the second wire portion 31Ad, and the third bonded portion 31Ae.

The first bonded portion 31Aa of the bonding wire 31A is bonded to the source electrode 11$A_S$ of the first MOSFET 11A in a state where the longitudinal direction of the first bonded portion 31Aa is parallel, in a plan view, with the long sides of the first MOSFET 11A (the long sides of the source electrode 11$A_S$). It is therefore possible to increase the bonding area between the bonding wire 31A and the source electrode 11$A_S$ and therefore the bonding strength between the bonding wire 31A and the source electrode 11$A_S$ can be increased.

The second bonded portion 31Ac of the bonding wire 31A is bonded to the anode electrode 21$A_A$ of the first Schottky barrier diode 21A, in a plan view, in a state where the longitudinal direction of the second bonded portion 31Ac is parallel with the long sides of the Schottky barrier diode 21A (the long sides of the anode electrode 21$A_A$). It is therefore possible to increase the bonding area between the bonding wire 31A and the anode electrode 21$A_A$ and therefore the bonding strength between the bonding wire 31A and the anode electrode 21$A_A$ can be increased.

The angle between the first wire portion 31Ab and the second wire portion 31Ad is 90 degrees or more in a plan view. The angle between the first wire portion 31Ab and the second bonded portion 31Ac as well as the angle between the second wire portion 31Ad and the second bonded portion 31Ac are also 90 degrees or more in a plan view. The connection between the first wire portion 31Ab and the second bonded portion 31Ac as well as the connection between the second wire portion 31Ad and the second bonded portion 31Ac are likely to be under load, but the angles are 90 degrees or more, whereby it is possible for the connections to have increased strength.

The gate electrode 11$B_G$ of the first MOSFET 11B is connected electrically to the gate lead 62 through a bonding wire 43B.

The source electrode 11$B_S$ of the first MOSFET 11B, the anode electrode 21$B_A$ of the corresponding first Schottky barrier diode 21B, and the source lead 63 are bonded electrically to each other through the bonding wire 31B, one end of which is bonded to the source electrode $11B_S$ of the first MOSFET 11B, the other end of which is bonded to the source lead 63, and the center of which is bonded to the anode electrode $21B_A$ of the first Schottky barrier diode 21B. The connections are achieved by stitch bonding.

The portion of the bonding wire 31B bonded to the source electrode $11B_S$ of the first MOSFET 11B will hereinafter be referred to as first bonded portion 31Ba, the portion bonded to the anode electrode $21B_A$ of the first Schottky barrier diode 21B will hereinafter be referred to as second bonded portion 31Bc, and the portion bonded to the source lead 63 will hereinafter be referred to as third bonded portion 31Be. In addition, the portion of the bonding wire 31B between the first bonded portion 31Ba and the second bonded portion 31Bc will hereinafter be referred to as first wire portion 31Bb, and the portion between the second bonded portion 31Bc and the third bonded portion 31Be will hereinafter be referred to as second wire portion 31Bd.

The source electrode $11B_S$ of the first MOSFET 11B and the anode electrode $21B_A$ of the first Schottky barrier diode 21B are connected electrically to each other through the portion (connective metal member) 32B of the entire length of the bonding wire 31B, including the first bonded portion 31Ba, the first wire portion 31Bb, and the second bonded portion 31Bc. The anode electrode $21B_A$ of the first Schottky bather diode 21B and the source lead 63 are connected electrically to each other through the portion (connective metal member) 33B of the entire length of the bonding wire 31B, including the second bonded portion 31Bc, the second wire portion 31Bd, and the third bonded portion 31Be.

The first bonded portion 31Ba of the bonding wire 31B is bonded to the source electrode $11B_S$ in a state where the longitudinal direction of the first bonded portion 31Ba is parallel, in a plan view, with the long sides of the first MOSFET 11B (the long sides of the source electrode $11B_S$). It is therefore possible to increase the bonding area between the bonding wire 31B and the source electrode $11B_S$ and therefore the bonding strength between the bonding wire 31B and the source electrode $11B_S$ can be increased.

The second bonded portion 31Bc of the bonding wire 31B is bonded to the anode electrode $21B_A$ in a state where the longitudinal direction of the second bonded portion 31Bc is parallel, in a plan view, with the long sides of the first Schottky barrier diode 21B (the long sides of the anode electrode $21B_A$). It is therefore possible to increase the bonding area between the bonding wire 31B and the anode electrode $21B_A$ and therefore the bonding strength between the bonding wire 31B and the anode electrode $21B_A$ can be increased.

The angle between the first wire portion 31Bb and the second wire portion 31Bd is 90 degrees or more in a plan view. The angle between the first wire portion 31Bb and the second bonded portion 31Bc as well as the angle between the second wire portion 31Bd and the second bonded portion 31Bc are also 90 degrees or more in a plan view. The connection between the first wire portion 31Bb and the second bonded portion 31Bc as well as the connection between the second wire portion 31Bd and the second bonded portion 31Bc are likely to be under load, but the angles are 90 degrees or more, whereby it is possible for the connections to have increased strength.

Although in the second exemplary variation, two sets of the first MOSFET and the first Schottky barrier diode are disposed on the surface of the die pad 61, three or more sets of the first MOSFET and the first Schottky barrier diode may be disposed.

Figure 9:
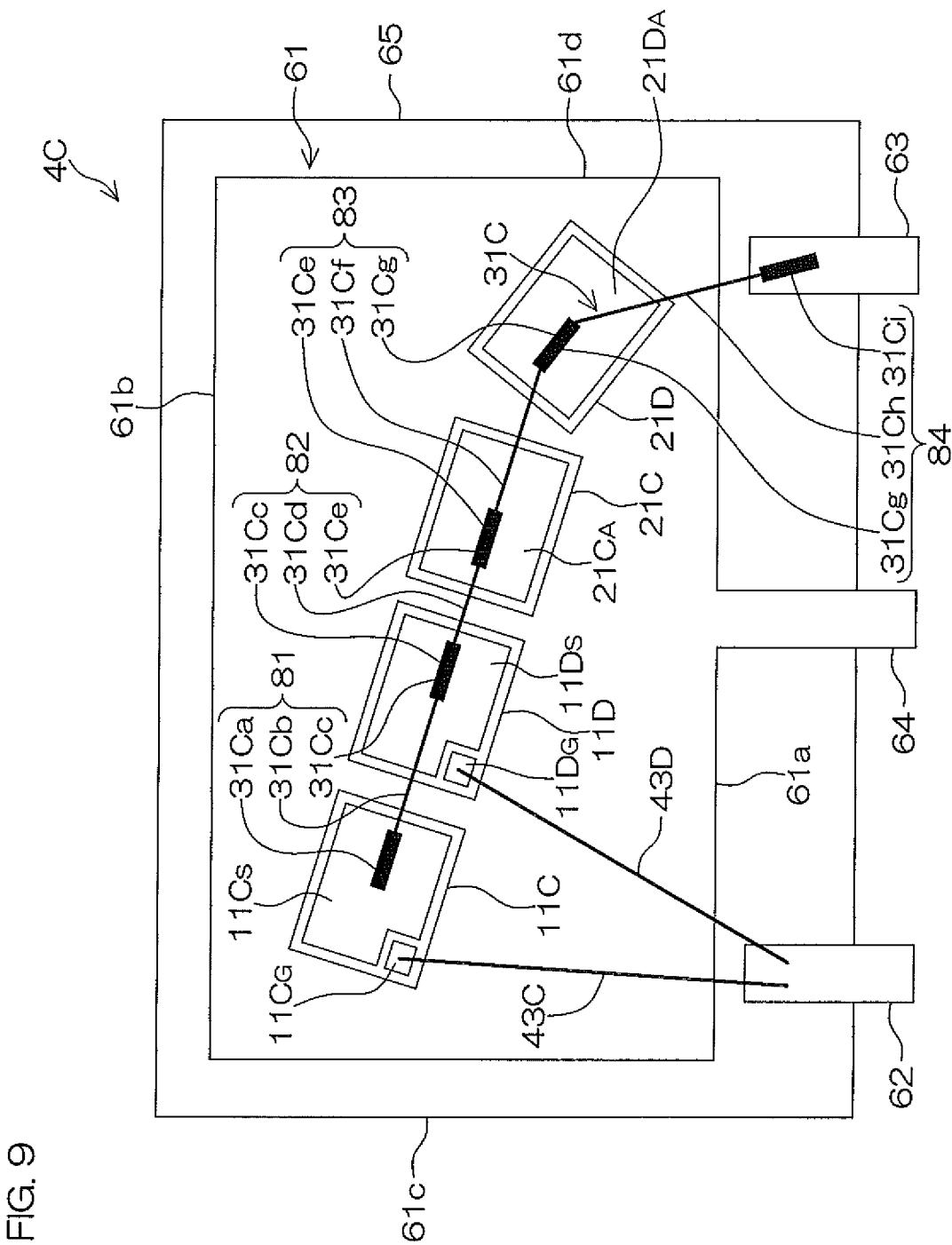
FIG. 9 is a schematic plan view showing a third exemplary variation of the package 4.
Figure 10:
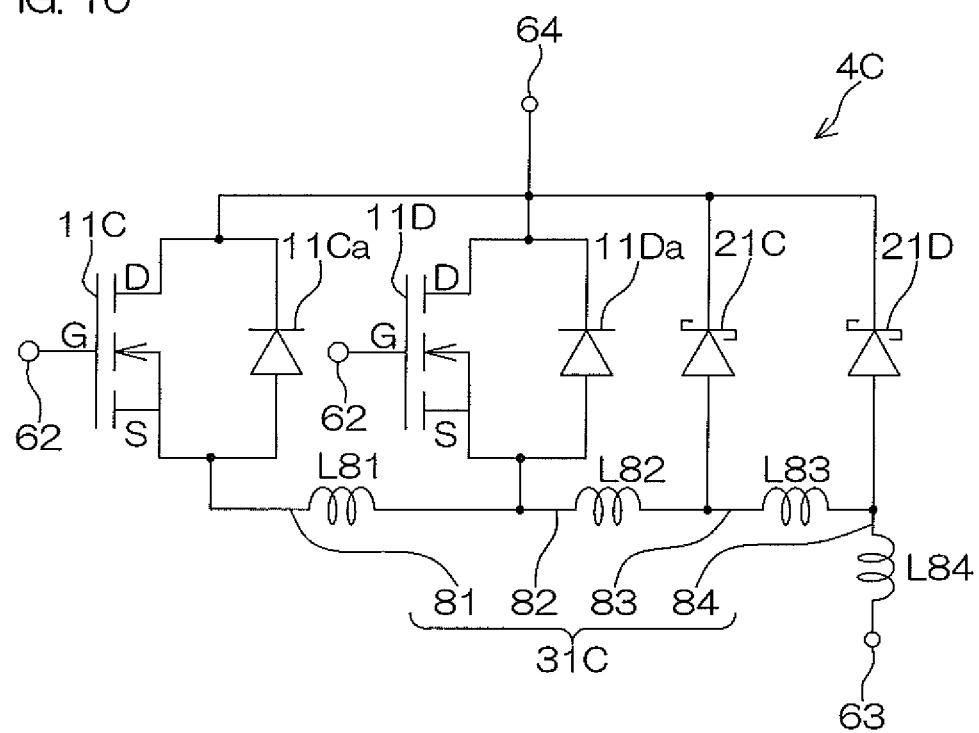
FIG. 10 is an electrical circuit diagram showing the electrical configuration of the third exemplary variation of the package 4.

FIG. 9 is a schematic plan view showing a third exemplary variation of the package 4. FIG. 10 is an electrical circuit diagram showing the electrical configuration of the third exemplary variation of the package 4.

In the package 4C according to the third exemplary variation, another first MOSFET and another first Schottky barrier diode are disposed between the first MOSFET 11 and the first Schottky barrier diode 21 with a space therebetween increased relative to the package 4 shown in FIG. 3.

The electrical configuration of the package 4C according to the third exemplary variation will be described with reference to FIG. 10.

The package 4C includes a drain lead terminal (drain lead) 64, a source lead terminal (source lead) 63, a gate lead terminal (gate lead) 62, two first MOSFETs 11C and 11D, and two first Schottky barrier diodes 21C and 21D. The first MOSFETs 11C and 11D incorporate first PN junction diodes (body diodes) 11Ca and 11Da, respectively. The anodes and cathodes of the first PN junction diodes 11Ca and 11Da are connected electrically to the sources and drains of the corresponding first MOSFETs 11C and 11D, respectively.

The first MOSFET 11C is connected in parallel to the first MOSFET 11D. The first MOSFET 11D is connected in parallel to the first Schottky barrier diode 21C. The first Schottky barrier diode 21C is connected in parallel to the first Schottky barrier diode 21D.

The drains of the first MOSFETs 11C and 11D and the cathodes of the first Schottky barrier diodes 21C and 21D are connected to the drain lead terminal 64. The source of the first MOSFET 11C is connected to the source of the first MOSFET 11D via a connective metal member 81. The source of the first MOSFET 11D is connected to the anode of the first Schottky barrier diode 21C via a connective metal member 82. The anode of the first Schottky barrier diode 21C is connected to the anode of the first Schottky barrier diode 21D via a connective metal member 83. The anode of the first Schottky barrier diode 21D is connected to the source lead terminal 63 via a connective metal member 84. The connective metal members 81, 82, 83, and 84 include parasitic inductances L81, L82, L83, and L84, respectively. The connective metal members 81 to 84 are composed of a single bonding wire 31C as will hereinafter be described.

The gates of the first MOSFETs 11C and 11D are connected to the gate lead terminal 62.

The internal structure of the package 4C will be described with reference to FIG. 9. In the following description, "front" represents the lower side in FIG. 9, "rear" represents the upper side in FIG. 9, "left" represents the left side in FIG. 9, and "right" represents the right side in FIG. 9.

The package 4C includes a die pad 61, the gate lead 62, the source lead (conductive member) 63, the two first MOSFETs 11C and 11D, the two first Schottky barrier diodes 21C and 21D, and a molding resin 65 encapsulating these components therein. The die pad 61 has an approximately rectangular shape elongated laterally in a plan view, having a pair of long sides 61a and 61b and a pair of short sides 61c and 61d. The first MOSFETs 11C and 11C and the first Schottky bather diodes 21C and 21D each have a rectangular shape in a plan view.

The die pad 61 has a lead portion (hereinafter referred to as "drain lead 64") protruding forward from approximately the center of the front long side 61a. The leading end of the drain lead 64 protrudes out of the molding resin 65. The gate lead 62 and the source lead 63 are disposed on either side of and parallel with the drain lead 64. In a plan view, the gate lead 62 is disposed in a manner opposed to a portion near the left end of the front long side 61a of the die pad 61, while the source lead 63 is disposed in a manner opposed to a portion near the right end of the front long side 61a of the die pad 61. One end of the gate lead 62 and the source lead 63 protrudes out of the molding resin 65. The die pad 61, the gate lead 62, and the source lead 63 are each composed of, for example, a copper or aluminum plate-like body.

On a surface of the die pad 61, the first MOSFETs 11C and 11D and the first Schottky barrier diodes 21C and 21D are disposed side by side in this order in the direction from the rear left to the front right on the surface of the die pad 61.

That is, the first MOSFET 11C is disposed at a rear left position on the surface of the die pad 61, and the first Schottky bather diode 21D is disposed at a front right position on the surface of the die pad 61, between which the first MOSFET 11D and the first Schottky barrier diode 21C are disposed side by side. The first MOSFET 11D is disposed closer to the first MOSFET 11C, while the first Schottky barrier diode 21C is disposed closer to the first Schottky barrier diode 21D.

The first MOSFETs 11C and 11D and the left first Schottky barrier diode 21C are disposed at a posture rotated, from a posture in which the four sides of the first MOSFETs 11C and 11D and the first Schottky barrier diode 21C are parallel, respectively, with the four sides 61a to 61d of the die pad 61 in a plan view, by a first required angle with respect to the die pad 61 such that the corresponding opposed sides of the first MOSFETs 11C and 11D and the first Schottky bather diode 21C and the die pad 61 are not parallel with each other.

On the other hand, the right first Schottky bather diode 21D is disposed at a posture rotated, from a posture in which the four sides of the first Schottky barrier diode 21D are parallel, respectively, with the four sides 61a to 61d of the die pad 61 in a plan view, by a second required angle with respect to the die pad 61 such that the corresponding opposed sides of the first Schottky bather diode 21D and the die pad 61 are not parallel with each other.

The long sides of the first MOSFETs 11C and 11D and the first Schottky barrier diodes 21C and 21D are inclined, in a plan view, with respect to the long sides 61a and 61b of the die pad 61 in a manner coming close to the front long side 61a so as to come close to the right short side 61d of the die pad 61. The angle of inclination of the long sides of the first Schottky barrier diode 21D with respect to the long sides 61a and 61b of the die pad 61 is greater than the angle of inclination of the long sides of the first MOSFETs 11C and 11D and the first Schottky barrier diode 21C with respect to the long sides 61a and 61b of the die pad 61.

The first MOSFETs 11C and 11D and the first Schottky barrier diodes 21C and 21D are die-bonded to the surface of the die pad 61. The first MOSFETs 11C and 11D each have a drain electrode (drain pad) on a surface opposed to the die pad 61, the drain electrode being bonded to the die pad 61 with conductive brazing metal. Also, the first MOSFETs 11C and 11D each have a source electrode (source pad) $11C_S$ or $11D_S$ and a gate electrode (gate pad) $11C_G$ or $11D_G$ on the surface opposite to the surface die-bonded to the die pad 61. The gate electrodes $11C_G$ and $11D_G$ are disposed at the front left corner on the surface of the respective first MOSFETs 11C and 11D.

The first Schottky barrier diodes 21C and 21D each have a cathode electrode (cathode pad) on a surface opposed to the die pad 61, the cathode electrode being bonded to the die pad 61 with conductive brazing metal. Also, the first Schottky bather diodes 21C and 21D each have an anode electrode (anode pad) $21C_A$ or $21D_A$ on the surface opposite to the surface die-bonded to the die pad 61.

The gate electrode $11C_G$ of the first MOSFET 11C is connected electrically to the gate lead 62 through a bonding wire 43C. The gate electrode $11D_G$ of the first MOSFET 11D is connected electrically to the gate lead 62 through a bonding wire 43D.

The source electrode $11C_S$ of the first MOSFET 11C, the source electrode $11D_S$ of the first MOSFET 11D, the anode electrode $21C_A$ of the first Schottky barrier diode 21C, the anode electrode $21D_A$ of the first Schottky bather diode 21D, and the source lead 63 are connected to each other through the bonding wire 31C, one end of which is bonded to the source electrode $11C_S$ of the first MOSFET 11C, the other end of which is bonded to the source lead 63, and the center of which is bonded at three points to the source electrode $11D_S$ of the first MOSFET 11D, the anode electrode $21C_A$ of the first Schottky barrier diode 21C, and the anode electrode $21D_A$ of the first Schottky bather diode 21D, respectively.

Specifically, the connections are achieved by stitch bonding starting from one of the source electrode $11C_S$ of the first MOSFET 11C and the source lead 63 through the source electrode $11D_S$ of the first MOSFET 11D, the anode electrode $21C_A$ of the first Schottky barrier diode 21C, and the anode electrode $21D_A$ of the first Schottky barrier diode 21D to end at the other of the source electrode $11C_S$ of the first MOSFET 11C and the source lead 63.

The portion of the bonding wire 31C bonded to the source electrode $11C_S$ of the first MOSFET 11C will hereinafter be referred to as first bonded portion 31Ca, the portion bonded to the source electrode $11D_S$ of the first MOSFET 11D will hereinafter be referred to as second bonded portion 31Cc, the portion bonded to the anode electrode $21C_A$ of the first Schottky barrier diode 21C will hereinafter be referred to as third bonded portion 31Ce, the portion bonded to the anode electrode $21D_A$ of the first Schottky barrier diode 21D will hereinafter be referred to as fourth bonded portion 31Cg, and the portion bonded to the source lead 63 will hereinafter be referred to as fifth bonded portion 31Ci. In addition, the portion of the bonding wire 31C between the first bonded portion 31Ca and the second bonded portion 31Cc will hereinafter be referred to as first wire portion 31Cb, the portion between the second bonded portion 31Cc and the third bonded portion 31Ce will hereinafter be referred to as second wire portion 31Cd, the portion between the third bonded portion 31Ce and the fourth bonded portion 31Cg will hereinafter be referred to as third wire portion 31Cf, and the portion between the fourth bonded portion 31Cg and the fifth bonded portion 31Ci will hereinafter be referred to as fourth wire portion 31Ch.

The source electrode $11C_S$ of the first MOSFET 11C and the source electrode $11D_S$ of the first MOSFET 11D are connected electrically to each other through the portion (connective metal member) 81 of the entire length of the bonding wire 31C, including the first bonded portion 31Ca, the first wire portion 31Cb, and the second bonded portion 31Cc. The source electrode $11D_S$ of the first MOSFET 11D and the anode electrode $21C_A$ of the first Schottky barrier diode 21C are connected electrically to each other through the portion (connective metal member) 82 of the entire length of the bonding wire 31C, including the second bonded portion 31Cc, the second wire portion 31Cd, and the third bonded portion 31Ce.

The anode electrode $21C_A$ of the first Schottky bather diode 21C and the anode electrode $21D_A$ of the first Schottky barrier diode 21D are connected electrically to each other through the portion (connective metal member) 83 of the entire length of the bonding wire 31C, including the third bonded portion 31Ce, the third wire portion 31Cf, and the fourth bonded portion 31Cg. The anode electrode $21D_A$ of the first Schottky barrier diode 21D and the source lead 63 are connected electrically to each other through the portion (connective metal member) 84 of the entire length of the bonding wire 31C, including the fourth bonded portion 31Cg, the fourth wire portion 31Ch, and the fifth bonded portion 31Ci.

The first bonded portion 31Ca of the bonding wire 31C is bonded to the source electrode $11C_S$ of the first MOSFET 11C in a state where the longitudinal direction of the first bonded portion 31Ca is parallel, in a plan view, with the long sides of the first MOSFET 11C (the long sides of the source electrode $11C_S$). The second bonded portion 31Cc of the bonding wire 31C is bonded to the source electrode $11D_S$ of the first MOSFET 11D in a state where the longitudinal direction of the second bonded portion 31Cc is parallel, in a plan view, with the long sides of the first MOSFET 11D (the long sides of the source electrode $11D_S$).

The third bonded portion 31Ce of the bonding wire 31C is bonded to the anode electrode $21C_A$ of the first Schottky barrier diode 21C in a state where the longitudinal direction of the third bonded portion 31Ce is parallel, in a plan view, with the long sides of the first Schottky barrier diode 21C (the long sides of the anode electrode $21C_A$). The fourth bonded portion 31Cg of the bonding wire 31C is bonded to the anode electrode $21D_A$ of the first Schottky barrier diode 21D in a state where the longitudinal direction of the fourth bonded portion 31Cg is parallel, in a plan view, with the long sides of the first Schottky barrier diode 21D (the long sides of the anode electrode $21D_A$).

It is therefore possible to increase the bonding area between the bonding wire 31C and the electrodes $11C_S$, $11D_S$, $21C_A$, and $21D_A$ and therefore the bonding strength between the bonding wire 31C and the electrodes $11C_S$, $11D_S$, $21C_A$, and $21D_A$ can be increased.

The first wire portion 31Cb, the second wire portion 31Cd, and the third wire portion 31Cf of the bonding wire 31C are connected in a straight line, in a plan view, via the second and third bonded portions 31Cc and 31Ce. The angle between the straight portion including the first to third wire portions 31Cb, 31Cd, and 31Cf and the fourth wire portion 31Ch (the angle between the third wire portion 31Cf and the fourth wire portion 31Ch) is 90 degrees or more in a plan view. The angle between the straight portion and the fourth bonded portion 31Cg (the angle between the third wire portion 31Cf and the fourth bonded portion 31Cg) is also 90 degrees or more in a plan view. Further, the angle between the fourth wire portion 31Ch and the fourth bonded portion 31Cg is also 90 degrees or more in a plan view.

The connection between the third wire portion 31Cf and the fourth bonded portion 31Cg as well as the connection between the fourth wire portion 31Ch and the fourth bonded portion 31Cg are likely to be under load, but the angles are 90 degrees or more, whereby it is possible for the connections to have increased strength.

Although in the third exemplary variation, one set of another first MOSFET and another first Schottky bather diode are disposed between the first MOSFET 11C and the first Schottky bather diode 21D, two or more sets of another first MOSFET and another first Schottky bather diode may be disposed between the first MOSFET 11C and the first Schottky bather diode 21D.

Figure 11:
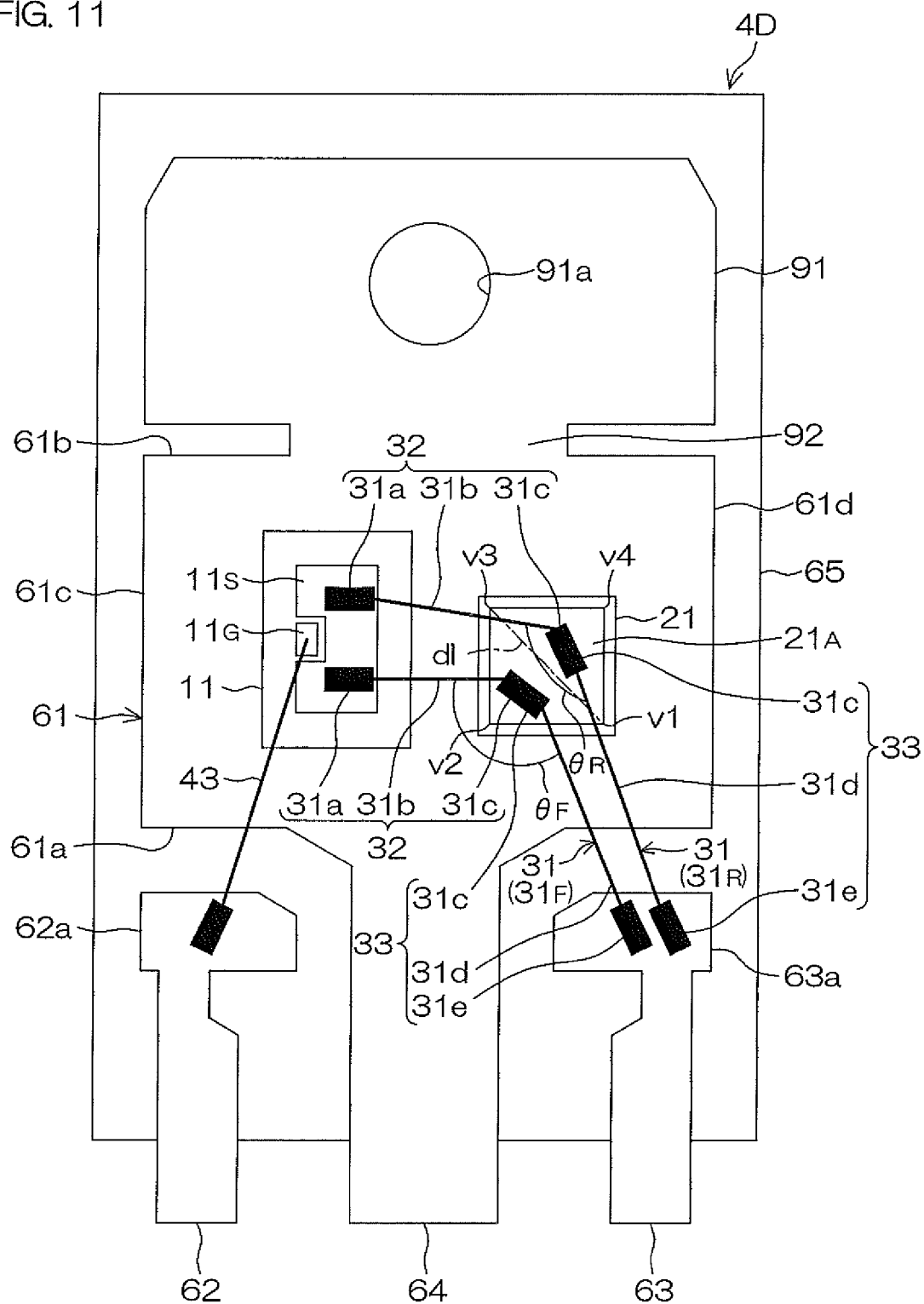
FIG. 11 is a schematic plan view showing a fourth exemplary variation of the package 4.

FIG. 11 is a schematic plan view showing a fourth exemplary variation of the package 4. In FIG. 11, components corresponding to those in FIG. 3 are designated by the same signs in FIG. 3. In the following description, "front" represents the lower side in FIG. 11, "rear" represents the upper side in FIG. 11, "left" represents the left side in FIG. 11, and "right" represents the right side in FIG. 11.

The package 4D includes a fixation plate 91, a die pad 61, a gate lead 62, a source lead (conductive member) 63, a first MOSFET 11, a first Schottky barrier diode 21, and a molding resin 65 encapsulating these components therein. In the package 4D, the back surfaces (corresponding to the reverse side of the paper of FIG. 11) of the die pad 61 and the fixation plate 91 are exposed to the outside of the molding resin 65.

The fixation plate 91 has an approximately rectangular shape elongated laterally in a plan view. The die pad 61 also has an approximately rectangular shape elongated laterally in a plan view, having a pair of long sides 61a and 61b and a pair of short sides 61c and 61d. The fixation plate 91 is disposed at the rear of the die pad 61. The fixation plate 91 and the die pad 61 are coupled to each other through a coupler 92 coupling the center of the front edge of the fixation plate 91 and the center of the rear edge of the die pad 61. A mounting hole 91a is formed at the center of the fixation plate 91. The molding resin 65 is also formed with a mounting hole that is aligned with the mounting hole 91a. The mounting holes 91a formed in the fixation plate 91 and the molding resin 65 can be used to mount the package 4D on the insulating substrate 8 (see FIG. 2).

The die pad 61 has a lead portion (hereinafter referred to as "drain lead 64") protruding forward from approximately the center of the front long side (first side) 61a. The drain lead 64 extends forward and obliquely upward from a portion coupled to the die pad 61 and then extends forward. The leading end of the drain lead 64 protrudes out of the molding resin 65.

The gate lead 62 and the source lead 63 are disposed on either side of and parallel with the drain lead 64. In a plan view, the gate lead 62 is disposed in a manner opposed to the left end of the front long side 61a of the die pad 61, while the source lead 63 is disposed in a manner opposed to the right end of the front long side 61a of the die pad 61. One end of the gate lead 62 is formed with a wide pad portion 62a, while the other end protrudes out of the molding resin 65. Similarly, one end of the source lead 63 is formed with a wide pad portion 63a, while the other end protrudes out of the molding resin 65. The die pad 61, the gate lead 62, and the source lead 63 are each composed of, for example, a copper or aluminum plate-like body.

On a surface of the die pad 61, the first MOSFET 11 and the first Schottky barrier diode 21 are disposed in such a manner that the first Schottky barrier diode 21 is positioned on the right side of the first MOSFET 11 in a plan view. The first MOSFET 11 has a rectangular shape in a plan view and is disposed at a posture in which the four sides thereof are parallel, respectively, with the four sides of the die pad 61 and the long sides thereof are parallel with the right short side 61d of the die pad 61. The first Schottky barrier diode 21 has a square shape in a plan view and is disposed at a posture in which the four sides thereof are parallel, respectively, with the four sides of the die pad 61.

The center of gravity of the first Schottky barrier diode 21 is disposed anterior to the center of gravity of the first MOSFET 11 in a plan view. Accordingly, the center of gravity of the first Schottky barrier diode 21 is positioned closer to the right short side (second side) 61d and the front long side (first side) 61a of the die pad 61 than the center of gravity of the first MOSFET 11 in a plan view.

The first MOSFET 11 and the first Schottky barrier diode 21 are die-bonded to the surface of the die pad 61. The first MOSFET 11 has a drain electrode (drain pad) on a surface opposed to the die pad 61, the drain electrode being bonded to the die pad 61 with conductive brazing metal. The first MOSFET 11 also has a source electrode (source pad) $11_S$ and a gate electrode (gate pad) $11_G$ on the surface opposite to the surface die-bonded to the die pad 61.

The source electrode $11_S$ has an approximately rectangular shape elongated anteroposteriorly in a plan view and is formed to cover almost all of the surface of the first MOSFET 11. In a plan view, the length of the long sides of the source electrode $11_S$ is, for example, about 4 mm, while the length of the short sides of the source electrode $11_S$ is, for example, about 3 mm. The anteroposterior center on the left edge of the source electrode $11_S$ is removed to form a region having an approximately rectangular shape in a plan view. In the removed region, the source electrode $11_S$ is not formed. The gate electrode $11_G$ is disposed in the removed region. The gate electrode $11_G$ has an approximately rectangular shape elongated anteroposteriorly in a plan view and the length of the long sides is, for example, about 0.6 mm, while the length of the short sides is, for example, about 0.4 mm.

The first Schottky barrier diode 21 has a cathode electrode (cathode pad) on a surface opposed to the die pad 61, the cathode electrode being bonded to the die pad 61 with conductive brazing metal. The first Schottky barrier diode 21 also has an anode electrode (anode pad) $21_A$ on the surface opposite to the surface die-bonded to the die pad 61. The anode electrode $21_A$ has an approximately square shape in a plan view and is formed to cover almost all of the surface of the first Schottky barrier diode 21. In a plan view, the length of each side of the anode electrode $21_A$ is about 3 mm.

The gate electrode $11_G$ of the first MOSFET 11 is connected electrically to the pad portion 62a of the gate lead 62 through a bonding wire 43. The connection is achieved by, for example, ball bonding using an Au wire with a diameter of about 25 to 75 µm or wedge bonding using an Al wire with a diameter of about 50 to 150 µm.

One end of multiple (two in this example) bonding wires 31 is bonded to the source electrode $11_S$ of the first MOSFET 11. The other end of the bonding wires 31 is bonded to the pad portion 63a of the source lead 63. The center of the bonding wires 31 is bonded to the anode electrode $21_A$ of the first Schottky barrier diode 21. The connections are achieved by wedge bonding.

More specifically, the connections are achieved by stitch bonding starting from one of the source electrode $11_S$ of the first MOSFET 11 and the source lead 63 through the anode electrode $21_A$ of the first Schottky barrier diode 21 to end at the other of the source electrode $11_S$ of the first MOSFET 11 and the source lead 63.

The portion of each of the bonding wires 31 bonded to the source electrode $11_S$ of the first MOSFET 11 will hereinafter be referred to as first bonded portion 31a, the portion bonded to the anode electrode $21_A$ of the first Schottky barrier diode 21 will hereinafter be referred to as second bonded portion 31c, and the portion bonded to the source lead 63 will hereinafter be referred to as third bonded portion 31e. In addition, the portion of each of the bonding wires 31 between the first bonded portion 31a and the second bonded portion 31c will hereinafter be referred to as first wire portion 31b, and the portion between the second bonded portion 31c and the third bonded portion 31e will hereinafter be referred to as second wire portion 31d.

The source electrode $11_S$ of the first MOSFET 11 and the anode electrode $21_A$ of the first Schottky barrier diode 21 are connected electrically to each other through the portion (connective metal member) 32 of the entire length of each of the bonding wires 31, including the first bonded portion 31a, the first wire portion 31b, and the second bonded portion 31c. The anode electrode $21_A$ of the first Schottky barrier diode 21 and the source lead 63 are connected electrically to each other through the portion (connective metal member) 33 of the entire length of each of the bonding wires 31, including the second bonded portion 31c, the second wire portion 31d, and the third bonded portion 31e.

The bonding wires 31 are, for example, Al wires with a diameter of about 250 to 400 µm. The bonded portions 31a, 31c, and 31e of the bonding wires 31 each have an approximately rectangular shape in a plan view elongated in the length direction of the bonding wires 31 and have a longitudinal length about four times the diameter of the bonding wires 31 (about 1 to 1.6 mm), while having a width length about two times the diameter of the bonding wires 31 (about 0.5 to 0.8 mm).

In a plan view, the first wire portion 31b and the second wire portion 31d of one of the bonding wires 31 are disposed approximately parallel, respectively, with the first wire portion 31b and the second wire portion 31d of the other bonding wire 31. That is, the bonding wires 31 are disposed in an anteroposteriorly spaced manner in a plan view. The front one of the bonding wires 31 may hereinafter be referred to as "first bonding wire $31_F$," and the rear bonding wire 31 may hereinafter be referred to as "second bonding wire $31_R$."

The first bonded portion 31a of the first bonding wire $31_F$ is bonded to the front (front half) one of two regions defined by anteroposteriorly bisecting the surface of the source electrode $11_S$ of the first MOSFET 11. On the other hand, the first bonded portion 31a of the second bonding wire $31_R$ is bonded to the rear (rear half) one of the two regions defined by anteroposteriorly bisecting the surface of the source electrode $11_S$ of the first MOSFET 11. It is therefore easy to bond the one end of each of the two bonding wires 31 to the source electrode $11_S$.

The first bonded portions 31a of the bonding wires 31 are bonded to the source electrode $11_S$ in a state where the longitudinal direction of the first bonded portions 31a is parallel, in a plan view, with the long sides of the first MOSFET 11 (the long sides of the source electrode $11_S$). It is therefore possible to increase the bonding area between the bonding wires 31 and the source electrode $11_S$ and therefore the bonding strength between the bonding wires 31 and the source electrode $11_S$ can be increased.

The front right vertex, the front left vertex, the rear left vertex, and the rear right vertex of the anode electrode $21_A$ of the Schottky barrier diode 21 are defined, respectively, as a first vertex v1, a second vertex v2, a third vertex v3, and a fourth vertex v4. The diagonal line running between the first vertex v1 and the third vertex v3 will hereinafter be referred to as "diagonal line d1."

The second bonded portion 31c of the first bonding wire $31_F$ is bonded to one of two regions defined by bisecting the surface of the anode electrode $21_A$ with the diagonal line d1, the one region being closer to the second vertex v2. On the other hand, the second bonded portion 31c of the second bonding wire $31_R$ is bonded to the other of the two regions defined by bisecting the surface of the anode electrode $21_A$ with the diagonal line d1, the other region being closer to the fourth vertex v4. It is therefore easy to bond the center of the two bonding wires 31 to the anode electrode $21_A$.

The angle $\theta_F$ (the narrower) between the first wire portion 31b and the second wire portion 31d of the first bonding wire $31_F$ and the angle $\theta_R$ (the narrower) between the first wire portion 31b and the second wire portion 31d of the second bonding wire $31_R$ are 90 degrees or more in a plan view. In addition, the angle $\theta_R$ is greater than the angle $\theta_F$ ($\theta_R > \theta_F$). Accordingly, it is easier to bond the center of the two bonding wires 31 to the anode electrode $21_A$.

Figure 12:
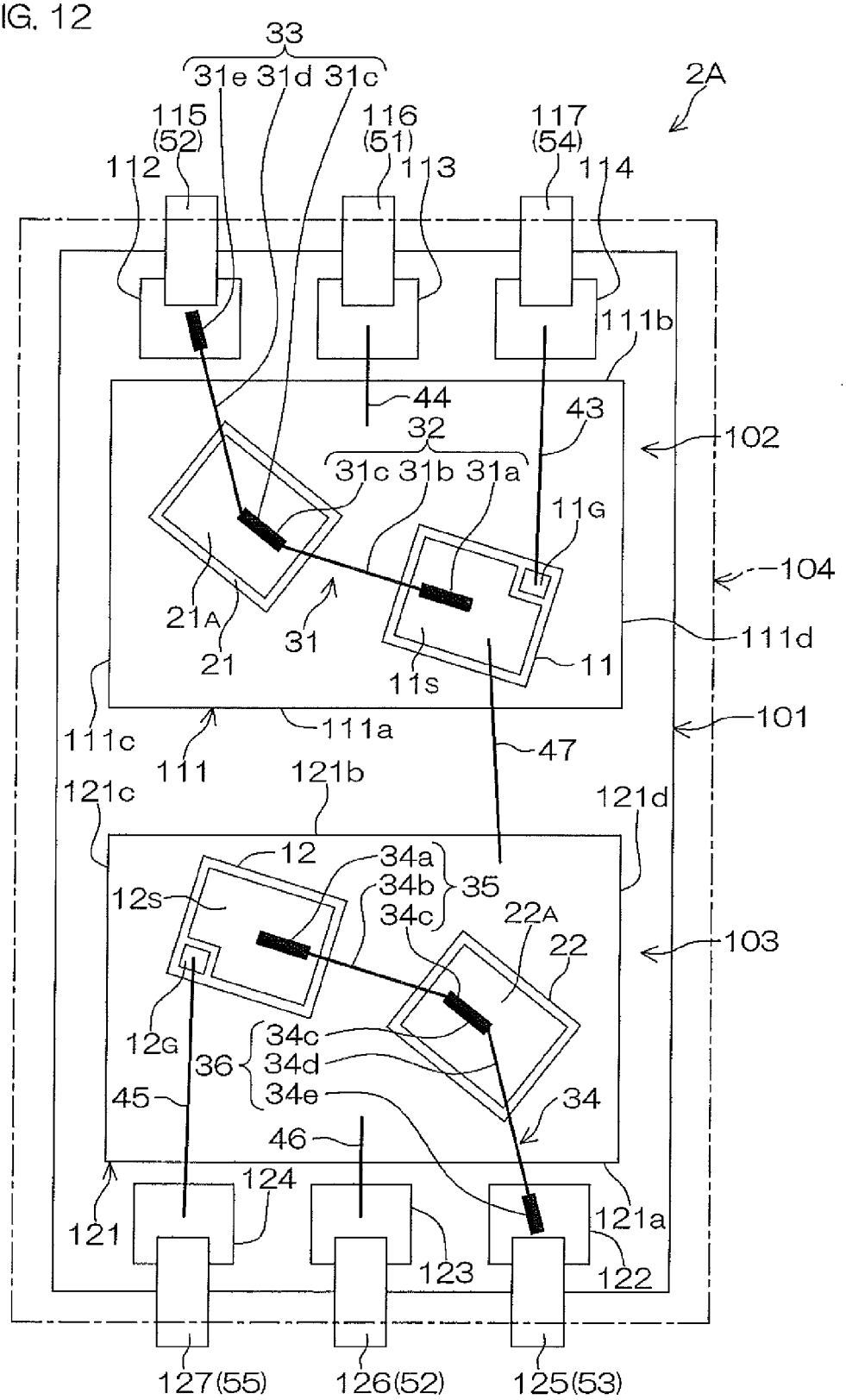
FIG. 12 is a schematic plan view showing an exemplary variation of the module 2 shown in FIG. 2.

FIG. 12 is a schematic plan view showing an exemplary variation of the module 2 shown in FIG. 2. In the following description, "front" represents the lower side in FIG. 12, "rear" represents the upper side in FIG. 12, "left" represents the left side in FIG. 12, and "right" represents the right side in FIG. 12.

The module 2A includes an insulating substrate 101, assemblies 102 and 103 fixed on the insulating substrate 101, and a molding resin 104 encapsulating these components therein. The insulating substrate 101 is formed in a rectangular shape elongated anteroposteriorly in a plan view.

The first assembly 102 for a high-side circuit and the second assembly 103 for a low-side circuit are disposed side by side in the anteroposterior direction on the insulating substrate 101. The first assembly 102 is disposed in a region between the longitudinal center and the rear short side of the insulating substrate 101. The second assembly 103 is disposed in a region between the longitudinal center and the front short side of the insulating substrate 101.

The first assembly 102 includes a die pad 111, first, second, and third lead connecting pads 112, 113, and 114, a source lead 115 (corresponding to the output terminal 52 shown in FIG. 1), a drain lead 116 (corresponding to the first power supply terminal 51 shown in FIG. 1), a gate lead 117 (corresponding to the gate terminal 54 shown in FIG. 1), a first MOSFET 11, and a first Schottky barrier diode 21.

The die pad 111 has a rectangular shape elongated laterally in a plan view, having a pair of long sides 111*a* and 111*b* and a pair of short sides 111*c* and 111*d*. The first MOSFET 11 and the first Schottky barrier diode 21 each have a rectangular shape in a plan view.

The three lead connecting pads 112, 113, and 114 are disposed in a region between the insulating substrate 101 and the rear long side 111*b* of the die pad 111. The first lead connecting pad 112 (conductive member) is disposed in a manner opposed to a portion near the left end of the rear long side 111*b* of the die pad 111. The second lead connecting pad 113 is disposed in a manner opposed to the longitudinal center of the rear long side 111*b* of the die pad 111. The third lead connecting pad 114 is disposed in a manner opposed to a portion near the right end of the rear long side 111*b* of the die pad 111.

The base end of the source lead 115 is bonded to the first lead connecting pad 112. The leading end of the source lead 115 protrudes out of the molding resin 104. The base end of the drain lead 116 is bonded to the second lead connecting pad 113. The leading end of the drain lead 116 protrudes out of the molding resin 104.

The base end of the gate lead 117 is bonded to the third lead connecting pad 114. The leading end of the gate lead 117 protrudes out of the molding resin 104. The die pad 111, the lead connecting pads 112, 113, and 114, the source lead 115, the drain lead 116, and the gate lead 117 are each composed of, for example, a copper or aluminum plate-like body.

On a surface of the die pad 111, the first MOSFET 11 and the first Schottky barrier diode 21 are disposed in such a manner that the first Schottky barrier diode 21 is positioned obliquely rearward to the left from the first MOSFET 11 in a plan view. That is, the first Schottky barrier diode 21 is disposed at a position closer to the left short side 111*c* and the rear long side 111*b* of the die pad 111 than the first MOSFET 11.

The first MOSFET 11 is disposed at a posture rotated, from a posture in which the four sides of the first MOSFET 11 are parallel, respectively, with the four sides 111*a* to 111*d* of the die pad 111 in a plan view, by a first required angle with respect to the die pad 111 such that the corresponding opposed sides of the first MOSFET 11 and the die pad 111 are not parallel with each other. The long sides of the first MOSFET 11 are inclined, in a plan view, with respect to the long sides 111*a* and 111*b* of the die pad 111 in a manner coming close to the rear long side 111*b* of the die pad 111 so as to come close to the left short side 111*c* of the die pad 111.

Similarly, the first Schottky barrier diode 21 is disposed at a posture rotated, from a posture in which the four sides of the first Schottky barrier diode 21 are parallel, respectively, with the four sides 111*a* to 111*d* of the die pad 111 in a plan view, by a second required angle with respect to the die pad 111 such that the corresponding opposed sides of the first Schottky barrier diode 21 and the die pad 111 are not parallel with each other. The long sides of the first Schottky barrier diode 21 are inclined, in a plan view, with respect to the long sides 111*a* and 111*b* of the die pad 111 in a manner coming close to the rear long side 111*b* of the die pad 111 so as to come close to the left short side 111*c* of the die pad 111. The angle of inclination of the long sides of the first Schottky barrier diode 21 with respect to the long sides 111*a* and 111*b* of the die pad 111 is greater than the angle of inclination of the long sides of the first MOSFET 11 with respect to the long sides 111*a* and 111*b* of the die pad 111.

The first MOSFET 11 and the first Schottky barrier diode 21 are die-bonded to the surface of the die pad 111. The first MOSFET 11 has a drain electrode (drain pad) on a surface opposed to the die pad 111, the drain electrode being bonded to the die pad 111 with conductive brazing metal. The first MOSFET 11 also has a source electrode (source pad) $11_S$ and a gate electrode (gate pad) $11_G$ on the surface opposite to the surface die-bonded to the die pad 111.

The source electrode $11_S$ has an approximately rectangular shape in a plan view and is formed to cover almost all of the surface of the first MOSFET 11. In a plan view, the length of the long sides of the source electrode $11_S$ is, for example, about 1.7 mm, while the length of the short sides of the source electrode $11_S$ is, for example, about 1.5 mm. The rear right corner of the source electrode $11_S$ is removed to form a region having an approximately square shape in a plan view. In the removed region, the source electrode $11_S$ is not formed. The gate electrode $11_G$ is disposed in the removed region. The gate electrode $11_G$ has an approximately square shape in a plan view and the length of each side is, for example, about 600 μm.

The first Schottky barrier diode 21 has a cathode electrode (cathode pad) on a surface opposed to the die pad 111, the cathode electrode being bonded to the die pad 111 with conductive brazing metal. The first Schottky barrier diode 21 also has an anode electrode (anode pad) $21_A$ on the surface opposite to the surface die-bonded to the die pad 111. The anode electrode $21_A$ has an approximately rectangular shape in a plan view and is formed to cover almost all of the surface of the first Schottky barrier diode 21. In a plan view, the length of the long sides of the anode electrode $21_A$ is about 1.5 mm, while the length of the short sides of the anode electrode $21_A$ is about 1.4 mm.

The die pad 111 is connected electrically to the second lead connecting pad 113 through a bonding wire 44. The connection is achieved by, for example, wedge bonding using an Al wire with a diameter of about 250 to 400 μm.

The gate electrode $11_G$ of the first MOSFET 11 is connected electrically to the third lead connecting pad 114 through a bonding wire 43. The connection is achieved by, for example, ball bonding using an Au wire with a diameter of about 25 to 75 μm or wedge bonding using an Al wire with a diameter of about 50 to 150 μm.

The source electrode $11_S$ of the first MOSFET 11, the anode electrode $21_A$ of the first Schottky barrier diode 21, and the first lead connecting pad 112 are connected electrically to each other through a bonding wire 31, one end of which is bonded to the source electrode $11_S$ of the first MOSFET 11, the other end of which is bonded to the first lead connecting pad 112, and the center of which is bonded to the anode electrode $21_A$ of the first Schottky barrier diode 21. Specifically, the connections are achieved by stitch bonding starting from one of the source electrode $11_S$ of the first MOSFET 11 and the first lead connecting pad 112 through the anode electrode $21_A$ of the first Schottky barrier diode 21 to end at the other of the source electrode $11_S$ of the first MOSFET 11 and the first lead connecting pad 112.

The portion of the bonding wire 31 bonded to the source electrode $11_S$ of the first MOSFET 11 will hereinafter be referred to as first bonded portion 31a, the portion bonded to the anode electrode $21_A$ of the first Schottky barrier diode 21 will hereinafter be referred to as second bonded portion 31c, and the portion bonded to the first lead connecting pad 112 will hereinafter be referred to as third bonded portion 31e. In addition, the portion of the bonding wire 31 between the first bonded portion 31a and the second bonded portion 31c will hereinafter be referred to as first wire portion 31b, and the portion between the second bonded portion 31c and the third bonded portion 31e will hereinafter be referred to as second wire portion 31d.

The source electrode $11_S$ of the first MOSFET 11 and the anode electrode $21_A$ of the first Schottky barrier diode 21 are connected electrically to each other through the portion (connective metal member) 32 of the entire length of the bonding wire 31, including the first bonded portion 31a, the first wire portion 31b, and the second bonded portion 31c. The anode electrode $21_A$ of the first Schottky barrier diode 21 and the first lead connecting pad 112 are connected electrically to each other through the portion (connective metal member) 33 of the entire length of the bonding wire 31, including the second bonded portion 31c, the second wire portion 31d, and the third bonded portion 31e.

The bonding wire 31 is, for example, an Al wire with a diameter of about 250 to 400 μm. The bonded portions 31a, 31c, and 31e each have an approximately rectangular shape in a plan view elongated in the length direction of the bonding wire 31 and have a longitudinal length about four times the diameter of the bonding wire 31 (about 1 to 1.6 mm), while having a width length about two times the diameter of the bonding wire 31 (about 0.5 to 0.8 mm) Accordingly, the size of the bonded portion 31a relative to the source electrode $11_S$ of the first MOSFET 11 and the size of the second bonded portion 31c relative to the anode electrode $21_A$ of the first Schottky barrier diode 21 are actually larger than those shown in FIG. 12.

The first bonded portion 31a of the bonding wire 31 is bonded to the source electrode $11_S$ of the first MOSFET 11 in a state where the longitudinal direction of the first bonded portion 31a is parallel, in a plan view, with the long sides of the first MOSFET 11 (the long sides of the source electrode $11_S$). It is therefore possible to increase the bonding area between the bonding wire 31 and the source electrode $11_S$ and therefore the bonding strength between the bonding wire 31 and the source electrode $11_S$ can be increased.

The second bonded portion 31c of the bonding wire 31 is bonded to the anode electrode $21_A$ of the first Schottky barrier diode 21 in a state where the longitudinal direction of the second bonded portion 31c is parallel with the long sides of the first Schottky barrier diode 21 (the long sides of the anode electrode $21_A$). It is therefore possible to increase the bonding area between the bonding wire 31 and the anode electrode $21_A$ and therefore the bonding strength between the bonding wire 31 and the anode electrode $21_A$ can be increased.

As mentioned above, the first lead connecting pad 112 is disposed in a manner opposed to a portion near the left end of the rear long side 111b of the die pad 111. The first Schottky barrier diode 21 is disposed at a position closer to the left short side 111c and the rear long side 111b of the die pad 111 than the first MOSFET 11.

This causes the angle between the first wire portion 31b and the second wire portion 31d to be 90 degrees or more in a plan view. The angle between the first wire portion 31b and the second bonded portion 31c and the angle between the second wire portion 31d and the second bonded portion 31c are each also 90 degrees or more in a plan view. The connection between the first wire portion 31b and the second bonded portion 31c as well as the connection between the second wire portion 31d and the second bonded portion 31c are likely to be under load, but the angles are 90 degrees or more, whereby it is possible for the connections to have increased strength.

Also, the first wire portion 31b is shorter than the second wire portion 31d, and the angle between the first wire portion 31b and the second bonded portion 31c is greater than the angle between the second wire portion 31d and the second bonded portion 31c in a plan view. The strength of the connection between the first wire portion 31b, which is shorter, and the second bonded portion 31c is thus higher than the strength of the connection between the second wire portion 31d, which is longer, and the second bonded portion 31c.

The second assembly 103 includes a die pad 121, first, second, and third lead connecting pads 122, 123, and 124, a source lead 125 (corresponding to the second power supply terminal 53 shown in FIG. 1), a drain lead 126 (corresponding to the output terminal 52 shown in FIG. 1), a gate lead 127 (corresponding to the gate terminal 55 shown in FIG. 1), a second MOSFET 12, and a second Schottky barrier diode 22.

The die pad 121 has a rectangular shape elongated laterally in a plan view, having a pair of long sides 121a and 121b and a pair of short sides 121c and 121d. The rear long side 121b of the die pad 121 is opposed to the front long side 111a of the die pad 111 of the first assembly 102. The second MOSFET 12 and the second Schottky bather diode 22 each have a rectangular shape in a plan view.

The three lead connecting pads 122, 123, and 124 are disposed in a region between the insulating substrate 101 and the front long side 121a of the die pad 121. The first lead connecting pad 122 (conductive member) is disposed in a manner opposed to a portion near the right end of the front long side 121a of the die pad 121. The second lead connecting pad 123 is disposed in a manner opposed to the longitudinal center of the front long side 121a of the die pad 121. The third lead connecting pad 124 is disposed in a manner opposed to a portion near the left end of the front long side 121a of the die pad 121.

The base end of the source lead 125 is bonded to the first lead connecting pad 122. The leading end of the source lead 125 protrudes out of the molding resin 104. The base end of the drain lead 126 is bonded to the second lead connecting pad 123. The leading end of the drain lead 126 protrudes out of the molding resin 104.

The base end of the gate lead 127 is bonded to the third lead connecting pad 124. The leading end of the gate lead 127 protrudes out of the molding resin 104. The die pad 121, the lead connecting pads 122, 123, and 124, the source lead 125, the drain lead 126, and the gate lead 127 are each composed of, for example, a copper or aluminum plate-like body.

On a surface of the die pad 121, the second MOSFET 12 and the second Schottky bather diode 22 are disposed in such a manner that the second Schottky bather diode 22 is positioned obliquely forward to the right from the second MOS- FET 12 in a plan view. That is, the second Schottky barrier diode 22 is disposed at a position closer to the right short side 121*d* and the front long side 121*a* of the die pad 121 than the second MOSFET 12.

The second MOSFET 12 is disposed at a posture rotated, from a posture in which the four sides of the second MOSFET 12 are parallel, respectively, with the four sides 121*a* to 121*d* of the die pad 121 in a plan view, by a first required angle with respect to the die pad 121 such that the corresponding opposed sides of the second MOSFET 12 and the die pad 121 are not parallel with each other. The long sides of the second MOSFET 12 are inclined, in a plan view, with respect to the long sides 121*a* and 121*b* of the die pad 121 in a manner coming close to the front long side 121*a* of the die pad 121 so as to come close to the right short side 121*d* of the die pad 121.

Similarly, the second Schottky barrier diode 22 is disposed at a posture rotated, from a posture in which the four sides of the second Schottky barrier diode 22 are parallel, respectively, with the four sides 121*a* to 121*d* of the die pad 121 in a plan view, by a second required angle with respect to the die pad 121 such that the corresponding opposed sides of the second Schottky barrier diode 22 and the die pad 121 are not parallel with each other. The long sides of the second Schottky barrier diode 22 are inclined, in a plan view, with respect to the long sides 121*a* and 121*b* of the die pad 121 in a manner coming close to the front long side 121*a* so as to come close to the right short side 121*d* of the die pad 121. The angle of inclination of the long sides of the second Schottky barrier diode 22 with respect to the long sides 121*a* and 121*b* of the die pad 121 is greater than the angle of inclination of the long sides of the second MOSFET 12 with respect to the long sides 121*a* and 121*b* of the die pad 121.

The second MOSFET 12 and the second Schottky barrier diode 22 are die-bonded to the surface of the die pad 111. The second MOSFET 12 has a drain electrode (drain pad) on a surface opposed to the die pad 121, the drain electrode being bonded to the die pad 121 with conductive brazing metal. The second MOSFET 12 also has a source electrode (source pad) $12_S$ and a gate electrode (gate pad) $12_G$ on the surface opposite to the surface die-bonded to the die pad 121.

The source electrode $12_S$ has an approximately rectangular shape in a plan view and is formed to cover almost all of the surface of the second MOSFET 12. In a plan view, the length of the long sides of the source electrode $12_S$ is, for example, about 1.7 mm, while the length of the short sides of the source electrode $12_S$ is, for example, about 1.5 mm. The front left corner of the source electrode $12_S$ is removed to form a region having an approximately square shape in a plan view. In the removed region, the source electrode $12_S$ is not formed. The gate electrode $12_G$ is disposed in the removed region. The gate electrode $12_G$ has an approximately square shape in a plan view and the length of each side is, for example, about 600 μm.

The second Schottky barrier diode 22 has a cathode electrode (cathode pad) on a surface opposed to the die pad 121, the cathode electrode being bonded to the die pad 121 with conductive brazing metal. The second Schottky bather diode 22 also has an anode electrode (anode pad) $22_A$ on the surface opposite to the surface die-bonded to the die pad 121. The anode electrode $22_A$ has an approximately rectangular shape in a plan view and is formed to cover almost all of the surface of the second Schottky bather diode 22. In a plan view, the length of the long sides of the anode electrode $22_A$ is about 1.5 mm, while the length of the short sides of the anode electrode $22_A$ is about 1.4 mm.

The die pad 121 is connected electrically to the source electrode $11_S$ of the first MOSFET 11 of the first assembly 102 through a bonding wire 47. The connection is achieved by, for example, wedge bonding using an Al wire with a diameter of about 250 to 400 μm.

The die pad 121 is connected electrically to the second lead connecting pad 123 through a bonding wire 46. The connection is achieved by, for example, wedge bonding using an Al wire with a diameter of about 250 to 400 μm.

The gate electrode $12_G$ of the second MOSFET 12 is connected electrically to the third lead connecting pad 124 through a bonding wire 45. The connection is achieved by, for example, ball bonding using an Au wire with a diameter of about 25 to 75 μm or wedge bonding using an Al wire with a diameter of about 50 to 150 μm.

The source electrode $12_S$ of the second MOSFET 12, the anode electrode $22_A$ of the second Schottky bather diode 22, and the first lead connecting pad 122 are bonded electrically to each other through a bonding wire 34, one end of which is bonded to the source electrode $12_S$ of the second MOSFET 12, the other end of which is bonded to the first lead connecting pad 122, and the center of which is bonded to the anode electrode $22_A$ of the second Schottky bather diode 22. Specifically, the connections are achieved by stitch bonding starting from one of the source electrode $12_S$ of the second MOSFET 12 and the first lead connecting pad 122 through the anode electrode $22_A$ of the second Schottky barrier diode 22 to end at the other of the source electrode $12_S$ of the second MOSFET 12 and the first lead connecting pad 122.

The portion of the bonding wire 34 bonded to the source electrode $12_S$ of the second MOSFET 12 will hereinafter be referred to as first bonded portion 34*a*, the portion bonded to the anode electrode $22_A$ of the second Schottky barrier diode 22 will hereinafter be referred to as second bonded portion 34*c*, and the portion bonded to the first lead connecting pad 122 will hereinafter be referred to as third bonded portion 34*e*. In addition, the portion of the bonding wire 34 between the first bonded portion 34*a* and the second bonded portion 34*c* will hereinafter be referred to as first wire portion 34*b*, and the portion between the second bonded portion 31*c* and the third bonded portion 31*e* will hereinafter be referred to as second wire portion 34*d*.

The source electrode $12_S$ of the second MOSFET 12 and the anode electrode $22_A$ of the second Schottky barrier diode 22 are connected electrically to each other through the portion (connective metal member) 35 of the entire length of the bonding wire 34, including the first bonded portion 34*a*, the first wire portion 34*b*, and the second bonded portion 34*c*. The anode electrode $22_A$ of the second Schottky bather diode 22 and the first lead connecting pad 122 are connected electrically to each other through the portion (connective metal member) 36 of the entire length of the bonding wire 34, including the second bonded portion 34*c*, the second wire portion 34*d*, and the third bonded portion 34*e*.

The bonding wire 34 is, for example, an Al wire with a diameter of about 250 to 400 μm. The bonded portions 34*a*, 34*c*, and 34*e* each have an approximately rectangular shape in a plan view elongated in the length direction of the bonding wire 34 and have a longitudinal length about four times the diameter of the bonding wire 34 (about 1 to 1.6 mm), while having a width length about two times the diameter of the bonding wire 34 (about 0.5 to 0.8 mm). Accordingly, the size of the bonded portion 34*a* relative to the source electrode $12_S$ of the second MOSFET 12 and the size of the second bonded portion 34*c* relative to the anode electrode $22_A$ of the second Schottky bather diode 22 are actually larger than those shown in FIG. 12.

The first bonded portion 34*a* of the bonding wire 34 is bonded to the source electrode $12_S$ of the second MOSFET 12 in a state where the longitudinal direction of the first bonded portion 34a is parallel, in a plan view, with the long sides of the second MOSFET 12 (the long sides of the source electrode $12_S$). It is therefore possible to increase the bonding area between the bonding wire 34 and the source electrode $12_S$ and therefore the bonding strength between the bonding wire 34 and the source electrode $12_S$ can be increased.

The second bonded portion 34c of the bonding wire 34 is bonded to the anode electrode $22_A$ of the second Schottky bather diode 22 in a state where the longitudinal direction of the second bonded portion 34c is parallel with the long sides of the anode electrode $22_A$ of the second Schottky barrier diode 22. It is therefore possible to increase the bonding area between the bonding wire 34 and the anode electrode $22_A$ and therefore the bonding strength between the bonding wire 34 and the anode electrode $22_A$ can be increased.

As mentioned above, the first lead connecting pad 122 is disposed in a manner opposed to a portion near the right end of the front long side 121a of the die pad 121. The second Schottky bather diode 22 is disposed at a position closer to the right short side 121d and the front long side 121a of the die pad 121 than the second MOSFET 12.

This causes the angle between the first wire portion 34b and the second wire portion 34d to be 90 degrees or more in a plan view. The angle between the first wire portion 34b and the second bonded portion 34c and the angle between the second wire portion 34d and the second bonded portion 34c are each also 90 degrees or more in a plan view. The connection between the first wire portion 34b and the second bonded portion 34c as well as the connection between the second wire portion 34d and the second bonded portion 34c are likely to be under load, but the angles are 90 degrees or more, whereby it is possible for the connections to have increased strength.

Also, the first wire portion 34b is shorter than the second wire portion 34d, and the angle between the first wire portion 34b and the second bonded portion 34c is greater than the angle between the second wire portion 34d and the second bonded portion 34c in a plan view. The strength of the connection between the first wire portion 34b, which is shorter, and the second bonded portion 34c is thus higher than the strength of the connection between the second wire portion 34d, which is longer, and the second bonded portion 34c.

Although the preferred embodiments of the present invention have heretofore been described, the present invention can be embodied in still other forms. For example, the MOSFETs 11 to 14 and 11A to 11D may be Si devices prepared using Si (silicon) as a semiconductor material, although they are SiC devices in the above-described preferred embodiments.

The preferred embodiments of the present invention, which have heretofore been described in detail, are merely specific examples used to clarify the technical contents of the present invention, and the present invention should not be understood as being limited to these specific examples, and the scope of the present invention is to be limited solely by the appended claims.

This application corresponds to Japanese Patent Application No. 2011-217717 filed in the Japan Patent Office on Sep. 30, 2011, the entire disclosure of which is incorporated herein by reference.

DESCRIPTION OF SIGNS

1 Inverter circuit
2, 2A, 3 Modules
4, 4A, 4B, 4C, 4D, 5 Packages
11 to 14, 11A to 11D MOSFETs
11a to 14a, 11Aa to 11Da PN junction diodes
$11_S$, $12_S$, $11A_S$ to $11D_S$ Source electrodes (first electrode pads)
$11_G$, $12_G$, $11A_G$ to $11D_G$ Gate electrodes (third electrode pads)
21 to 24, 21A to 21D Schottky barrier diodes
$21_A$, $22_A$, $21A_A$ to $21D_A$ Anode electrodes (second electrode pads)
61, 66, 111, 121 Die pads
63, 68 Source leads (conductive members)
112, 122 Lead connecting pads (conductive members)
31, 31A, 31B, 31C, 34 Bonding wires
31a, 34a, 31Aa, 31Ba, 31Ca Bonded portions
31c, 34c, 31Ac, 31Bc, 31Cg Bonded portions
31b, 31Ab, 31Bb, 31Cb, 34b Wire portions
31d, 31Ad, 31Bd, 31Ch, 34d Wire portions

The invention claimed is:

1. A semiconductor device comprising:
a die pad;
a bipolar device die-bonded to a surface of the die pad, the bipolar device having a first electrode pad on a surface opposite to a die-bonded surface;
a unipolar device die-bonded to the surface of the die pad, the unipolar device having a second electrode pad to be connected electrically to the first electrode pad on a surface opposite to a die-bonded surface;
a conductive member disposed laterally to the die pad to be connected electrically with the second electrode pad; and
a bonding wire, one end of which is bonded to the first electrode pad, the other end of which is bonded to the conductive member, and the center of which is bonded to the second electrode pad, wherein
a first wire portion of the bonding wire between the portion bonded to the first electrode pad and the portion bonded to the second electrode pad is at an angle of 90 degrees or more, in a plan view, with respect to a second wire portion of the bonding wire between the portion bonded to the second electrode pad and the portion bonded to the conductive member.

2. The semiconductor device according to claim 1, wherein the die pad has a quadrangular shape in a plan view, and wherein
the conductive member is disposed in a manner opposed to a portion near one end of a predetermined first side of the die pad in a plan view, and wherein
one of the four sides of the die pad extending perpendicular to the first side from the one end of the first side near which the conductive member is disposed being defined as a second side in a plan view, the unipolar device is disposed at a position closer to the second side and the first side of the die pad than the bipolar device.

3. The semiconductor device according to claim 2, wherein the bipolar device has a quadrangular shape in a plan view, and
the bipolar device is die-bonded to the die pad at a posture rotated, from a posture in which the four sides of the bipolar device are parallel, respectively, with the four sides of the die pad in a plan view, by a required angle with respect to the die pad such that the corresponding opposed sides of the bipolar device and the die pad are not parallel with each other, and wherein
the length direction of one of the four sides of the bipolar device inclined with respect to the first side of the die pad in a manner coming close to the first side so as to come close to the second side of the die pad is parallel, in a plan view, with the length direction of the portion of the bonding wire bonded to the first electrode pad.

4. The semiconductor device according to claim 2, wherein
the bipolar device has a rectangular shape in a plan view, and
long sides of the bipolar device are inclined with respect to the first side of the die pad and extend toward the intersection between the first side and the second side of the die pad.

5. The semiconductor device according to claim 2, wherein
the unipolar device has a quadrangular shape in a plan view, and
the unipolar device is die-bonded to the die pad at a posture rotated, from a posture in which the four sides of the unipolar device are parallel, respectively, with the four sides of the die pad in a plan view, by a required angle with respect to the die pad such that the corresponding opposed sides of the unipolar device and the die pad are not parallel with each other, and wherein
the length direction of one of the four sides of the unipolar device inclined with respect to the first side of the die pad in a manner coming close to the first side so as to come close to the second side of the die pad is parallel, in a plan view, with the length direction of the portion of the bonding wire bonded to the second electrode pad.

6. The semiconductor device according to claim 5, wherein
the unipolar device has a rectangular shape in a plan view, and
long sides of the unipolar device are inclined with respect to the first side of the die pad and extend toward the intersection between the first side and the second side of the die pad.

7. The semiconductor device according to claim 3, wherein
the surface opposite to the die-bonded surface of the bipolar device is provided with a third electrode pad at a position different from that of the first electrode pad, the third electrode pad corresponding to a gate electrode if the bipolar device is a MOS transistor, to a gate electrode if the bipolar device is an IGBT, or to a base electrode if the bipolar device is a bipolar transistor, and wherein
the third electrode pad is disposed at one of the corners on the surface of the bipolar device farther from the second side but closer to the first side of the die pad.

8. The semiconductor device according to claim 1, wherein
the die pad has a quadrangular shape in a plan view, and wherein
the conductive member is disposed in a manner opposed to a portion near one end of a predetermined first side of the die pad in a plan view, and wherein
one of the four sides of the die pad extending perpendicular to the first side from the one end of the first side near which the conductive member is disposed being defined as a second side in a plan view, the bipolar device and the unipolar device are disposed side by side in the direction parallel with the second side and the unipolar device is disposed closer to the first side than the bipolar device.

9. The semiconductor device according to claim 8, wherein
the bipolar device has a quadrangular shape in a plan view, and
the bipolar device is die-bonded to the die pad at a posture in which the four sides of the bipolar device are parallel, respectively, with the four sides of the die pad in a plan view, and wherein
the length direction of one of the four sides of the bipolar device parallel with the second side of the die pad is parallel, in a plan view, with the length direction of the portion of the bonding wire bonded to the first electrode pad.

10. The semiconductor device according to claim 8, wherein
the unipolar device has a quadrangular shape in a plan view, and
the unipolar device is die-bonded to the die pad at a posture in which the four sides of the unipolar device are parallel, respectively, with the four sides of the die pad in a plan view, and wherein
the length direction of one of the four sides of the unipolar device parallel with the second side of the die pad is parallel, in a plan view, with the length direction of the portion of the bonding wire bonded to the second electrode pad.

11. The semiconductor device according to claim 9, wherein
the surface opposite to the die-bonded surface of the bipolar device is provided with a third electrode pad at a position different from that of the first electrode pad, the third electrode pad corresponding to a gate electrode if the bipolar device is a MOS transistor, to a gate electrode if the bipolar device is an IGBT, or to a base electrode if the bipolar device is a bipolar transistor, and wherein
the third electrode pad is disposed at one of the corners on the surface of the bipolar device farther from the second side but closer to the first side of the die pad.

12. The semiconductor device according to claim 1, wherein
the first wire portion is shorter than the second wire portion, and wherein
the angle between the portion of the bonding wire bonded to the second electrode pad and the first wire portion is greater, in a plan view, than the angle between the portion of the bonding wire bonded to the second electrode pad and the second wire portion.

13. The semiconductor device according to claim 2, wherein
a plurality of sets of the bipolar device and the unipolar device are disposed on the surface of the die pad in a spaced manner in the direction parallel with the second side of the die pad and connected in parallel to each other.

14. The semiconductor device according claim 1, wherein
another bipolar device having a fourth electrode pad and another unipolar device having a fifth electrode pad are disposed side by side between the bipolar device and the unipolar device on the surface of the die pad, and the center of the first wire portion is bonded to the fourth electrode pad and the fifth electrode pad.

15. The semiconductor device according to claim 1, wherein
the die pad has a quadrangular shape in a plan view, and wherein
the conductive member is disposed in a manner opposed to a portion near one end of a predetermined first side of the die pad in a plan view, and wherein
one of the four sides of the die pad extending perpendicular to the first side from the one end of the first side near which the conductive member is disposed being defined as a second side in a plan view, the unipolar device is disposed at a position closer to the second side of the die pad than the bipolar device, and wherein
a plurality of the bonding wires are provided and disposed in a spaced manner in a plan view, and wherein
the angle between the first wire portion and the second wire portion is greater at the position of each bonding wire farther from the first side of the die pad.

16. The semiconductor device according to claim 15, wherein
the plurality of bonding wires are two bonding wires, and wherein
the bipolar device has a rectangular shape in a plan view and the first electrode pad has a rectangular shape in a plan view, and
the bipolar device is die-bonded to the die pad at a posture in which the long sides of the bipolar device are parallel with the second side of the die pad, and wherein
the first bonded portion of one of the two bonding wires positioned farther from the first side of the die pad is bonded to one of two regions defined by bisecting the surface of the first electrode pad along the second side of the die pad, the one region being farther from the first side, and wherein
the first bonded portion of the other of the two bonding wires positioned closer to the first side of the die pad is bonded to the other of the two regions defined by bisecting the surface of the first electrode pad along the second side of the die pad, the other region being closer to the first side.

17. The semiconductor device according to claim 16, wherein
the unipolar device has a square shape in a plan view and the second electrode pad has a square shape in a plan view, and
the unipolar device is die-bonded to the die pad at a posture in which the four sides of the unipolar device are parallel, respectively, with the four sides of the die pad, and wherein
one of the four vertices of the second electrode pad closer to the first side and the second side of the die pad being defined as a first vertex, one of the four vertices closer to the first side but farther from the second side of the die pad being defined as a second vertex, the vertex diagonal to the first vertex being defined as a third vertex, and the vertex diagonal to the second vertex being defined as a fourth vertex,
the second bonded portion of one of the two bonding wires positioned farther from the first side of the die pad is bonded to one of two regions defined by bisecting the surface of the second electrode with the diagonal line running between the first vertex and the third vertex, the one region being closer to the fourth vertex, and wherein
the second bonded portion of the other of the two bonding wires positioned closer to the first side of the die pad is bonded to the other of the two regions defined by bisecting the surface of the second electrode pad with the diagonal line, the other region being closer to the second vertex.

18. The semiconductor device according to claim 15, wherein
the center of gravity of the unipolar device is disposed at a position closer to the first side of the die pad than the center of gravity of the bipolar device in a plan view.

19. The semiconductor device according to claim 1, wherein
the bipolar device includes a PN junction diode structure and the unipolar device includes a Schottky barrier diode.

20. A semiconductor device comprising two semiconductor devices according claim 1, wherein the first electrode pad in one of the semiconductor devices is connected to the die pad in the other of the semiconductor devices through a connective metal member.

* * * * *